US012563726B2

(12) United States Patent
Kim et al.

(10) Patent No.: US 12,563,726 B2
(45) Date of Patent: Feb. 24, 2026

(54) SEMICONDUCTOR DEVICES AND DATA STORAGE SYSTEMS INCLUDING THE SAME

(71) Applicant: Samsung Electronics Co., Ltd., Suwon-si (KR)

(72) Inventors: Junsuk Kim, Suwon-si (KR); Donghoon Kwon, Hwaseong-si (KR); Kiwoong Kim, Seoul (KR); Chungki Min, Hwaseong-si (KR); Youngbeom Pyon, Suwon-si (KR); Changsun Hwang, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 701 days.

(21) Appl. No.: 17/689,280

(22) Filed: Mar. 8, 2022

(65) Prior Publication Data

US 2022/0406812 A1     Dec. 22, 2022

(30) Foreign Application Priority Data

Jun. 18, 2021    (KR) ........................ 10-2021-0079360

(51) Int. Cl.
*H10B 43/27*         (2023.01)
*H01L 23/522*        (2006.01)
(Continued)

(52) U.S. Cl.
CPC ......... *H10B 43/27* (2023.02); *H01L 23/5226* (2013.01); *H01L 23/5283* (2013.01);
(Continued)

(58) Field of Classification Search
CPC ........ H10B 43/27; H10B 41/10; H10B 41/27; H10B 41/35; H10B 43/10; H10B 43/35;
(Continued)

(56) References Cited

U.S. PATENT DOCUMENTS

2009/0121271 A1    5/2009  Son et al.
2012/0276696 A1    11/2012 Yang et al.
(Continued)

FOREIGN PATENT DOCUMENTS

KR      2009/0047614 A    5/2009
KR      2012/0122673 A    11/2012
KR      101974352 B1      5/2019

OTHER PUBLICATIONS

Office Action for Korean Application No. 10-2021-0079360 dated Jul. 10, 2025.

*Primary Examiner* — Ali Naraghi
*Assistant Examiner* — Samuel Jonathan Smith
(74) *Attorney, Agent, or Firm* — Harness, Dickey & Pierce, P.L.C.

(57)                ABSTRACT

A semiconductor device includes a substrate; a first stack structure including first gate electrodes on the substrate; and a second stack structure on the first stack structure; wherein the first stack structure includes a first lower staircase region, a second lower staircase region, and a third lower staircase region, wherein the second stack structure includes a first upper staircase region, a second upper staircase region, a third upper staircase region, and at least one through portion penetrating the second stack structure and on the first to third lower staircase regions, wherein the first lower staircase region has a same shape as a shape of the first upper staircase region, the second lower staircase region has a same shape as a shape of the second upper staircase region, and the third lower staircase region has a same shape as a shape of the third upper staircase region.

15 Claims, 22 Drawing Sheets

(51) Int. Cl.

| | | |
|---|---|---|
| *H01L 23/528* | (2006.01) | |
| *H10B 41/10* | (2023.01) | |
| *H10B 41/27* | (2023.01) | |
| *H10B 41/35* | (2023.01) | |
| *H10B 43/10* | (2023.01) | |
| *H10B 43/35* | (2023.01) | |

(52) U.S. Cl.
CPC ............. *H10B 41/10* (2023.02); *H10B 41/27* (2023.02); *H10B 41/35* (2023.02); *H10B 43/10* (2023.02); *H10B 43/35* (2023.02)

(58) Field of Classification Search
CPC ........ H10B 41/40; H10B 41/50; H10B 43/40; H10B 43/50; H10B 43/20; H10B 41/20; H10B 41/30; H10B 43/30; H01L 23/5226; H01L 23/5283; H01L 25/18; H01L 21/823475; H01L 25/0657
See application file for complete search history.

(56) References Cited

U.S. PATENT DOCUMENTS

| | | | |
|---|---|---|---|
| 2014/0162420 A1 | 6/2014 | Oh et al. | |
| 2017/0141032 A1* | 5/2017 | Lee ..................... | H01L 23/5226 |
| 2017/0179154 A1* | 6/2017 | Furihata ............... | H10D 89/911 |
| 2019/0206494 A1* | 7/2019 | Han ..................... | G11C 7/1066 |
| 2020/0251490 A1 | 8/2020 | Matsumoto et al. | |
| 2020/0294850 A1 | 9/2020 | Lee | |
| 2020/0295028 A1* | 9/2020 | Kim ..................... | H10B 43/20 |
| 2021/0013216 A1 | 1/2021 | Lee | |
| 2021/0057336 A1 | 2/2021 | Shao et al. | |
| 2021/0057442 A1 | 2/2021 | Zhang et al. | |

* cited by examiner

A

S10

FORM LOWER STACK STRUCTURE —S11

FORM UPPER STACK STRUCTURE —S12

FORM THROUGH PORTION PENETRATING
UPPER STACK STRUCTURE —S13

FORM FIRST UPPER STAIRCASE REGION,
SECOND PRELIMINARY UPPER STAIRCASE REGION,
FIRST LOWER STAIRCASE REGION, AND
SECOND PRELIMINARY LOWER STAIRCASE REGION —S14

FORM SECOND UPPER STAIRCASE REGION AND
SECOND LOWER STAIRCASE REGION —S15

SEMICONDUCTOR DEVICES AND DATA STORAGE SYSTEMS INCLUDING THE SAME

CROSS TO REFERENCE TO RELATED APPLICATION(S)

This application claims benefit of priority to Korean Patent Application No. 10-2021-0079360 filed on Jun. 18, 2021 in the Korean Intellectual Property Office, the disclosure of which is incorporated herein by reference in its entirety.

BACKGROUND

Example embodiments of the present disclosure relate to a semiconductor device and a data storage system including the same.

In a data storage system requiring data storage, a semiconductor device capable of storing high-capacity data is required. Accordingly, a method of increasing data storage capacity of a semiconductor device is being researched. For example, as one method of increasing data storage capacity of a semiconductor device, a semiconductor device including memory cells arranged three-dimensionally, instead of memory cells arranged two-dimensionally, has been suggested.

SUMMARY

Some example embodiments of the present inventive concepts provide a semiconductor device having improved integration density.

Some example embodiments of the present inventive concepts provide a data storage system including a semiconductor device having improved integration density.

Some example embodiments of the present inventive concepts provide a method of manufacturing a semiconductor device having improved productivity.

According to some example embodiments of the present inventive concepts, a semiconductor device includes a substrate having a first region and a second region; a first stack structure including first gate electrodes spaced apart from each other on the substrate and first interlayer insulating layers alternately stacked with the first gate electrodes; a capping insulating layer on the first stack structure; a second stack structure including second gate electrodes spaced apart from each other on the capping insulating layer and second interlayer insulating layers alternately stacked with the second gate electrodes; and channel structures penetrating the first and second stack structures and including a channel layer in the first region, wherein the first stack structure includes a first lower staircase region, a second lower staircase region more adjacent to the substrate than the first lower staircase region, and a third lower staircase region more adjacent to the substrate than the second lower staircase region, in the second region, wherein the second stack structure includes a first upper staircase region, a second upper staircase region more adjacent to the substrate than the first upper staircase region, a third upper staircase region more adjacent to the substrate than the second upper staircase region, and at least one through portion penetrating the second stack structure and on the first to third lower staircase regions, in the second region, wherein the through portion has a first width on a lower end and has a second width greater than the first width on an upper end; and wherein the first lower staircase region has a same shape as a shape of the first upper staircase region, the second lower staircase region has a same shape as a shape of the second upper staircase region, and the third lower staircase region has a same shape as a shape of the third upper staircase region.

According to some example embodiments of the present inventive concepts, a semiconductor device includes a substrate having a first region and a second region; a first stack structure including first gate electrodes spaced apart from each other on the substrate and first interlayer insulating layers alternately stacked with the first gate electrodes; a second stack structure including second gate electrodes spaced apart from each other on the first stack structure and second interlayer insulating layers alternately stacked with the second gate electrodes; a capping insulating layer between the first stack structure and the second stack structure and having a thickness greater than a thickness of each of the first interlayer insulating layers and a thickness of each of the second interlayer insulating layers; and channel structures penetrating the first and second stack structures and including a channel layer, in the first region, wherein the first stack structure includes a first lower staircase region, and a second lower staircase region more adjacent to the substrate than the first lower staircase region, in the second region, wherein the second stack structure includes a first upper staircase region, a second upper staircase region more adjacent to the substrate than the first upper staircase region, and at least one through portion penetrating the second stack structure and the capping insulating layer and connected to the first and second lower staircase regions, in the second region, and wherein at least one side surface of the through portion has a continuous slope to the first and second lower staircase regions.

According to some example embodiments of the present inventive concepts, a data storage system includes a semiconductor storage device including a first substrate; circuit devices disposed on the first substrate; lower wiring lines electrically connected to the circuit devices; a second substrate on the lower wiring lines and having a first region and a second region; a first stack structure including first gate electrodes spaced apart from each other on the second substrate and first interlayer insulating layers stacked alternately with the first gate electrodes; a second stack structure including second gate electrodes spaced apart from each other on the first stack structure and second interlayer insulating layers alternately stacked with the second gate electrodes; a capping insulating layer between the first stack structure and the second stack structure and having a thickness greater than a thickness of each of the first interlayer insulating layer and a thickness of each of the second interlayer insulating layers; and channel structures penetrating the first and second stack structures in the first region and including a channel layer; and an input/output pad electrically connected to the circuit devices; and a controller electrically connected to the semiconductor storage device through the input/output pad and configured to control the semiconductor storage device, wherein the first stack structure includes a first lower staircase region, and a second lower staircase region more adjacent to the first substrate than the first lower staircase region, in the second region, wherein the second stack structure includes a first upper staircase region, a second upper staircase region more adjacent to the first substrate than the first upper staircase region, and at least one through portion penetrating the second stack structure and the capping insulating layer and connected to the first and second lower staircase regions, in the second region, and wherein at least one side surface of the through portion has a continuous slope to the first and second lower staircase regions.

According to some example embodiments of the present inventive concepts, a method of manufacturing a semiconductor device includes forming a first stack structure by alternately stacking first sacrificial insulating layers and first interlayer insulating layers on a substrate including a first region and a second region; forming a second stack structure by alternately stacking second sacrificial insulating layers and second interlayer insulating layers on the first stack structure; forming a through portion penetrating the second stack structure in the second region; forming a first upper staircase region including an upper pad region in which the second sacrificial insulating layers extend by different lengths, a second preliminary upper staircase region spaced apart from the first upper staircase region, a first lower staircase region including a lower pad region in which the first sacrificial insulating layers extend by different lengths, connected to the through portion and having the same shape as a shape of the first upper staircase region, and a second preliminary lower staircase region spaced apart from the first lower staircase region and connected to the through portion; and forming a second upper staircase region and a second lower staircase region having the same shape by etching a portion of the second stack structure in the second preliminary upper staircase region and a portion of the first stack structure in the second preliminary lower staircase region.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present disclosure will be described as follows with reference to the accompanying drawings.

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. Further, regardless of whether numerical values are modified as "about" or "substantially," it will be understood that these values should be construed as including a of ±10% around the stated numerical value.

Figure 1:
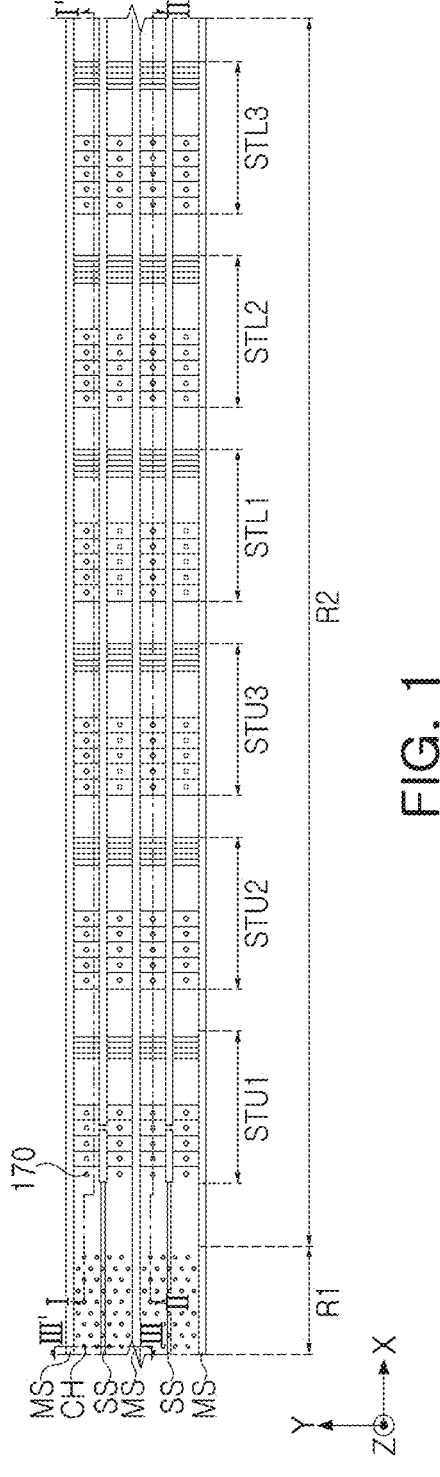
FIG. 1 is a schematic plan view of a semiconductor device according to an example embodiment.

FIG. 1 is a schematic plan view of a semiconductor device according to an example embodiment.

Figure 2A:
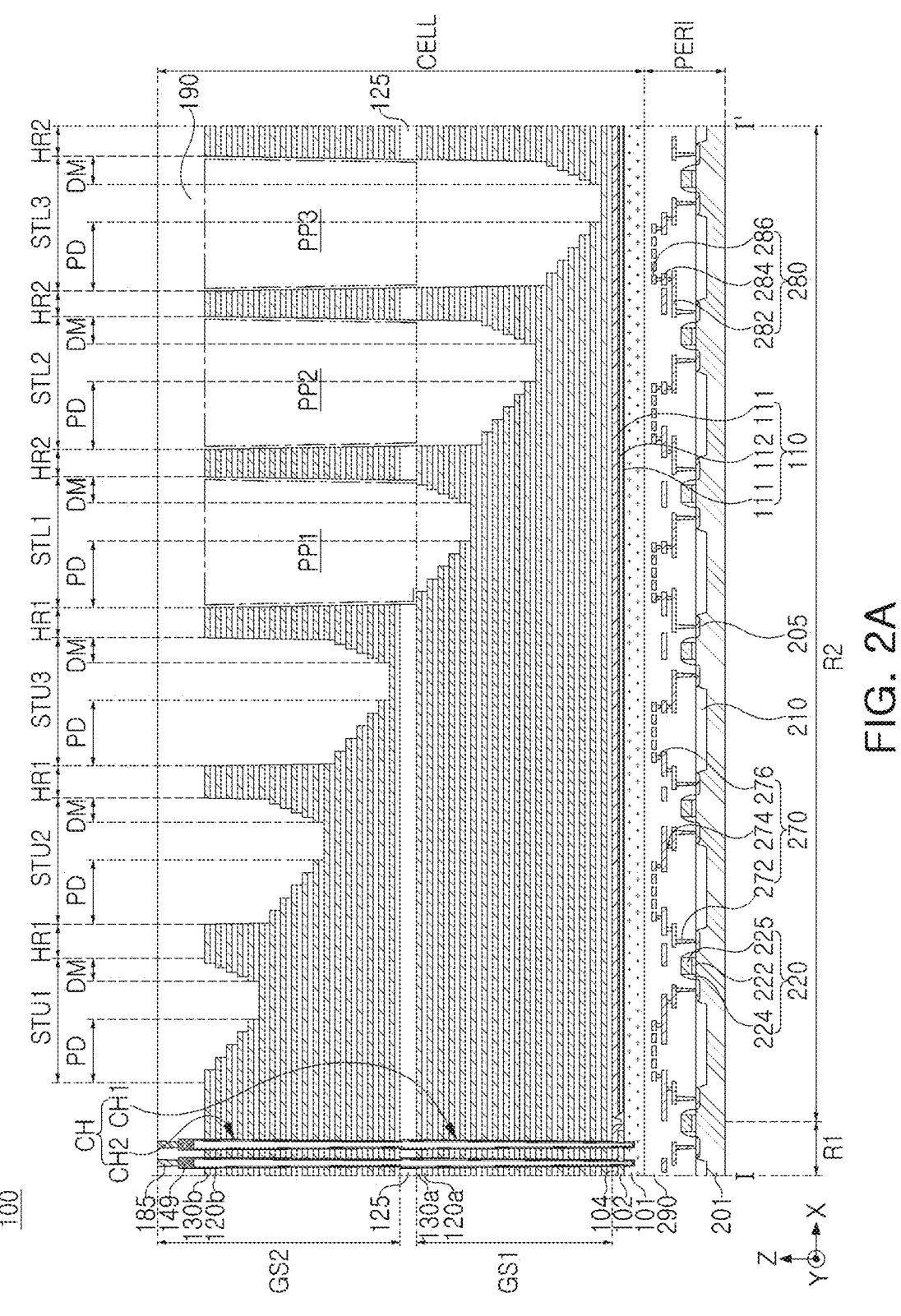
FIGS. 2A to 2C are schematic cross-sectional views of a semiconductor device according to an example embodiment.
Figure 2B:
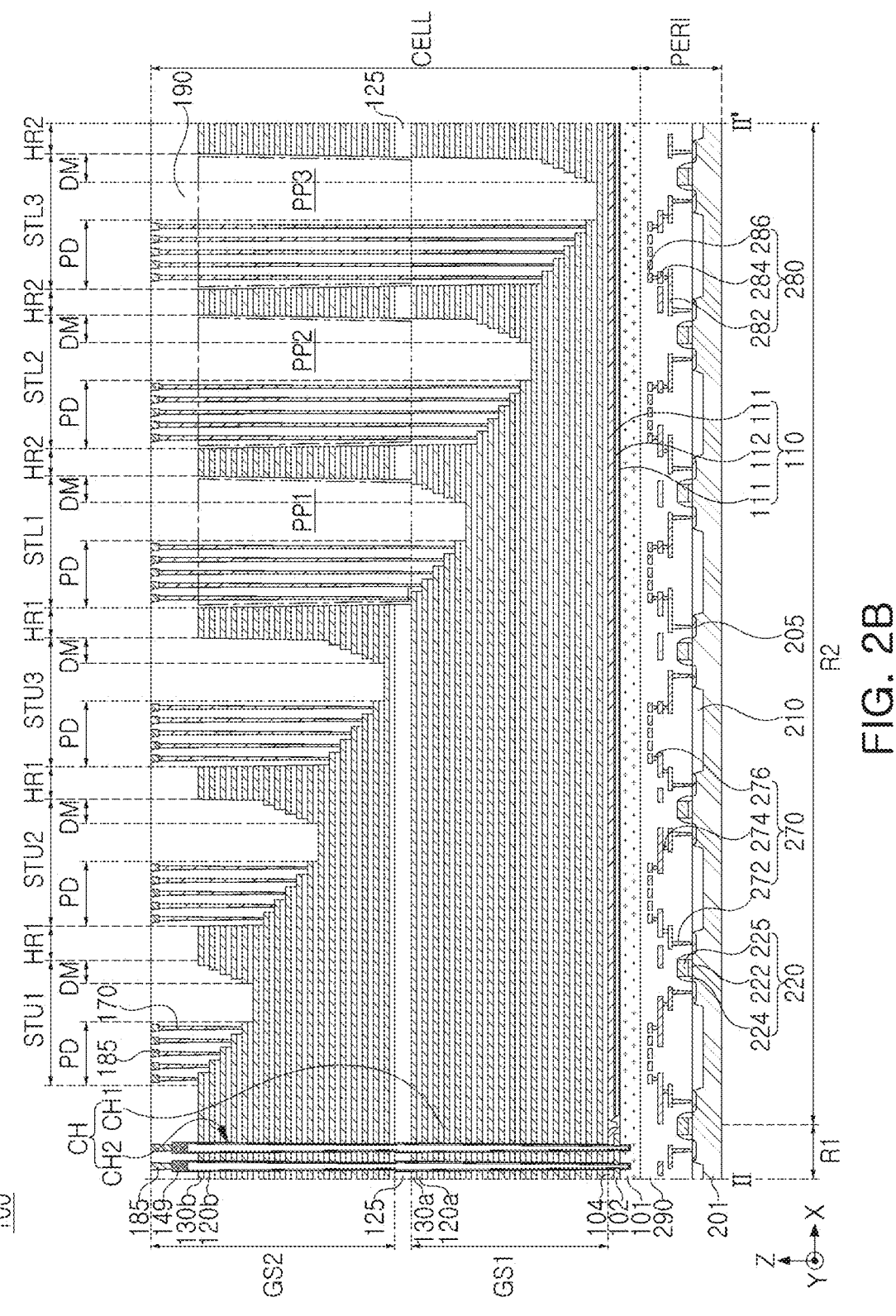
Figure 2C:
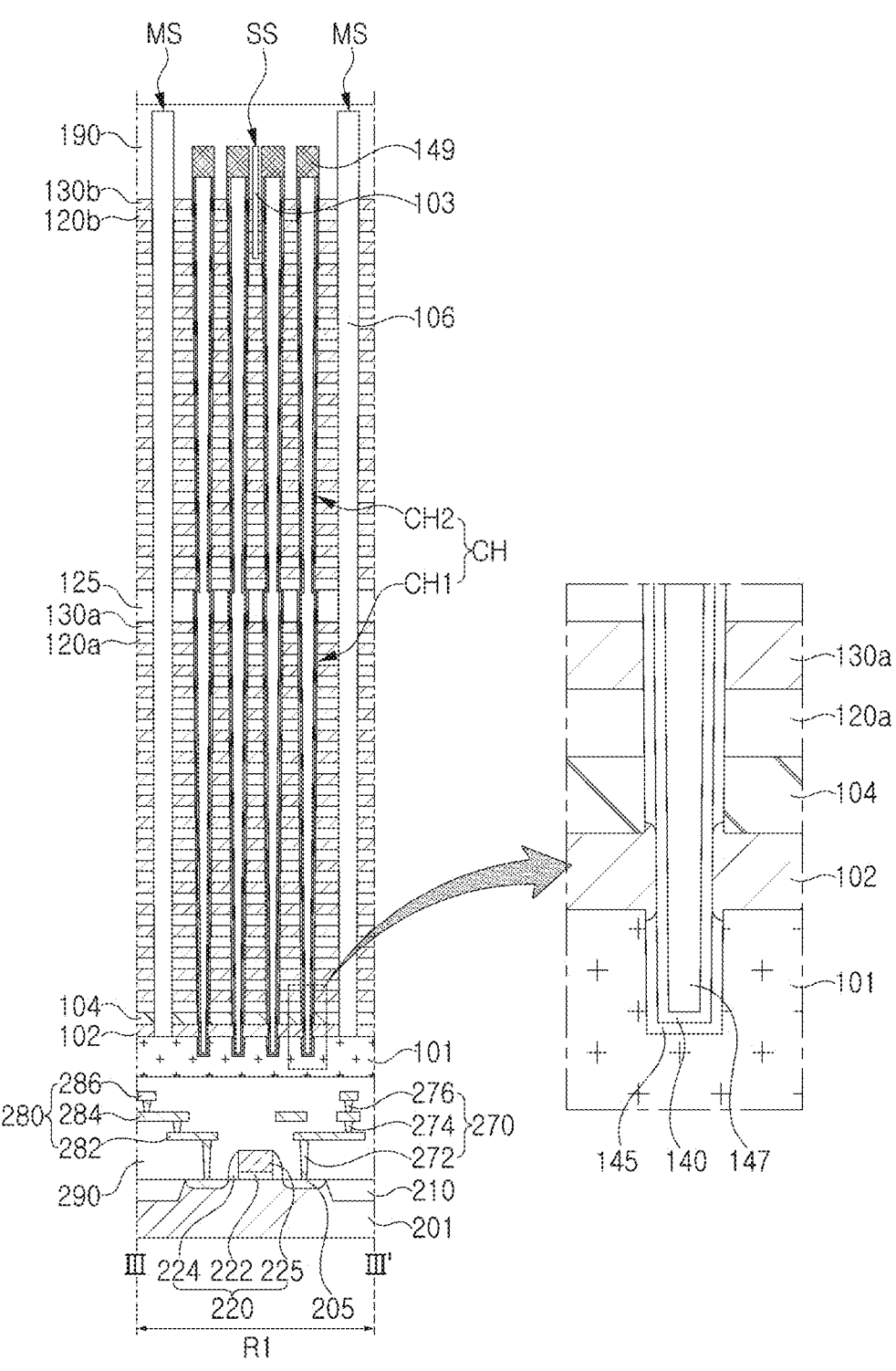

FIGS. 2A to 2C are schematic cross-sectional views of a semiconductor device taken along lines I-I', II-IP, and in FIG. 1 according to an example embodiment.

Referring to FIGS. 1 to 2C, a semiconductor device 100 may include a peripheral circuit region PERI which may be a first semiconductor structure including a first substrate 201 and/or a memory cell region CELL which may be a second semiconductor structure including a second substrate 101. The memory cell region CELL may be disposed on an upper end of the peripheral circuit region PERI. Alternatively, in example embodiments, the cell region CELL may be disposed on a lower end of the peripheral circuit region PERI.

The peripheral circuit region PERI may include a first substrate 201, impurity regions 205 and/or device isolation layers 210 in the first substrate 201, circuit devices 220 disposed on the first substrate 201, lower contact plugs 270, lower wiring lines 280, and/or a peripheral region insulating layer 290.

The first substrate 201 may have an upper surface extending in the x direction and the y direction. The first substrate 201 may be referred to as a base substrate. An active region may be defined in the first substrate 201 by the device isolation layers 210. The impurity regions 205 including impurities may be disposed in a portion of the active region. The first substrate 201 may include a semiconductor material, such as, for example, a group IV semiconductor, a group III-V compound semiconductor, and/or a group II-VI compound semiconductor. The first substrate 201 may be provided as a bulk wafer or an epitaxial layer.

The circuit devices 220 may include a planar transistor. Each, or one or more, of the circuit devices 220 may include a circuit gate dielectric layer 222, a spacer layer 224, and/or a circuit gate electrode 225. The impurity regions 205 may be disposed in the first substrate 201 on both sides of the circuit gate electrode 225 as source/drain regions.

The lower contact plugs 270 and the lower wiring lines 280 may form a lower wiring structure electrically connected to the circuit devices 220 and/or the impurity regions 205. The lower contact plugs 270 may have a cylindrical shape, and/or the lower wiring lines 280 may have a linear shape. The lower contact plugs 270 may include first to third lower contact plugs 272, 274, and/or 276 disposed in order from the first substrate 201. The lower wiring lines 280 may include first to third lower wiring lines 282, 284, and/or 286 disposed in order from the first substrate 201. The lower contact plugs 270 and/or the lower wiring lines 280 may include a conductive material, such as, for example, tungsten (W), copper (Cu), aluminum (Al), and/or the like, and each, or one or more, of the elements may further include a diffusion barrier. Pad layers (not shown) may be further disposed on the third lower wiring lines 286. However, in example embodiments, the number of layers and the arrangement form of the lower contact plugs 270 and/or the lower wiring lines 280 may be varied.

The peripheral region insulating layer 290 may be disposed on the circuit device 220 on the first substrate 201. The peripheral region insulating layer 290 may be formed of an insulating material and may include one or more insulating layers.

The memory cell region CELL may include a second substrate 101 having a first region R1 and/or a second region R2, a first stack structure GS1 including first gate electrodes 130a stacked to be spaced apart from each other on the second substrate 101 and/or first interlayer insulating layers 120a alternately stacked with the first gate electrodes 130a, a capping insulating layer 125 disposed on the first stack structure GS1, a second stack structure GS2 including second gate electrodes 130b stacked to be spaced apart from each other on the capping insulating layer 125 and/or second interlayer insulating layers 120b alternately stacked with the second gate electrodes 130b, and/or channel structures CH disposed to penetrate the first stack structure GS1 and/or the second stack structure GS2.

The memory cell region CELL may further include separation regions MS extending by penetrating the first stack structure GS1 and/or the second stack structure GS2, first and/or second horizontal conductive layers 102 and 104 disposed below the first gate electrodes 130a on the first region R1, a horizontal insulating layer 110 disposed below the gate electrodes 130 on the second region R2, upper separation regions SS penetrating a portion of the second stack structure GS2, contact plugs 170 connected to the first gate electrodes 130a of the first stack structure GS1 and/or the second gate electrodes 130b of the second stack structure GS2, upper contacts 185 on the channel structures CH and/or the contact plugs 170, and/or a cell region insulating layer 190 covering the first gate electrodes 130a and/or the second gate electrodes 130b.

The first region R1 of the second substrate 101 may be a region, in which the first and/or second gate electrodes 130a and 130b may be vertically stacked and/or the channel structures CH may be disposed, and/or memory cells may be disposed. The second region R2 may be a region, in which the first gate electrodes 130a and/or the second gate electrodes 130b may extend by different lengths. The second region R2 may be disposed on at least one end of the first region R1 in at least one direction, such as, for example, the x direction. The second substrate 101 may function as at least a portion of a common source line of the semiconductor device 100 in the form of a plate layer.

The second substrate 101 may have an upper surface extending in the x direction and the y direction. The second substrate 101 may include a semiconductor material, such as, for example, a group IV semiconductor, a group III-V compound semiconductor, and/or a group II-VI compound semiconductor. For example, a group IV semiconductor may include silicon, germanium, and/or silicon-germanium. The second substrate 101 may further include impurities. The second substrate 101 may be provided as a polycrystalline semiconductor layer such as a polycrystalline silicon layer and/or an epitaxial layer.

The first and second horizontal conductive layers 102 and 104 may be stacked in order on the upper surface of the first region R1 of the second substrate 101. The first horizontal conductive layer 102 may not extend to the second region R2 of the second substrate 101, and the second horizontal conductive layer 104 may extend to the second region R2. The first horizontal conductive layer 102 may function as a portion of the common source line of the semiconductor device 100, and/or may function as a common source line together with the second substrate 101, for example. As illustrated in the enlarged diagram in FIG. 2C, a portion of the first horizontal conductive layer 102 may be directly connected to the channel layer 140 by passing through a gate dielectric layer 145 around the channel layer 140. The second horizontal conductive layer 104 may be in contact with the second substrate 101 in partial regions in which the first horizontal conductive layer 102 and/or the horizontal insulating layer 110 are not disposed. The second horizontal conductive layer 104 may be bent while covering an end of the first horizontal conductive layer 102 and/or the horizontal insulating layer 110 in the partial regions, and may extend to the second substrate 101.

The first and/or second horizontal conductive layers 102 and 104 may include a semiconductor material, such as polycrystalline silicon, for example. In this case, at least the first horizontal conductive layer 102 may be doped with impurities of the same conductivity type as that of the second substrate 101, and the second horizontal conductive layer 104 may be a doped layer and/or may include impurities diffused from the first horizontal conductive layer 102. However, the material of the second horizontal conductive layer 104 is not limited to a semiconductor material, and may be replaced with an insulating layer.

The horizontal insulating layer 110 may be disposed on the second substrate 101 in parallel to the first horizontal conductive layer 102 in at least a portion of the second region R2. The horizontal insulating layer 110 may include first and second horizontal insulating layers 111 and 112 alternately stacked on the second region R2 of the second substrate 101. The horizontal insulating layer 110 may be layer remaining after a portion of the horizontal insulating layer 110 is replaced with the first horizontal conductive layer 102 in the process of manufacturing the semiconductor device 100.

The horizontal insulating layer 110 may include silicon oxide, silicon nitride, silicon carbide, and/or silicon oxynitride. The first horizontal insulating layers 111 and the second horizontal insulating layer 112 may include different insulating materials. For example, the first horizontal insulating layers 111 may be formed of the same material as that of the interlayer insulating layers 120, and the second horizontal insulating layer 112 may be formed of a material different from that of the interlayer insulating layers 120.

The first and second gate electrodes 130a and 130b may be vertically stacked to be spaced apart from each other on the first region R1, may extend from the first region R1 to the second region R2 by different lengths, and/or may form a stepped structure in the form of a staircase in a portion of the second region R2. The first and second gate electrodes 130a and 130b may be disposed to have a stepped structure in the y direction as well.

The first gate electrodes 130a may include lower gate electrodes forming a gate of the ground selection transistor and/or memory gate electrodes forming a plurality of memory cells, and/or the second gate electrodes 130b may include memory gate electrodes forming a plurality of memory cells, and/or upper gate electrodes forming gates of the string select transistors. The number of the memory gate electrodes forming the memory cells may be determined depending on capacity of the semiconductor device 100. According to an example embodiment, the number of the upper and lower gate electrodes may be 1 to 4 or more, and the upper and lower gate electrodes may have the same or different structure as that of the memory gate electrodes. In example embodiments, the first and/or second gate electrodes 130a and 130b may further include an erase gate electrode disposed above the upper gate electrodes and/or below the lower gate electrodes and forming an erase transistor used in an erase operation using a gate induced drain leakage (GIDL) current. Also, a portion of the first and/or second gate electrodes 130a and 130b, memory gate electrodes adjacent to the upper or lower gate electrodes, for example, may be dummy gate electrodes.

The first and/or second gate electrodes 130a and 130b may include a metal material, such as, for example, tungsten (W). In example embodiments, the first and/or second gate electrodes 130a and 130b may include polycrystalline silicon and/or a metal silicide material. In example embodiments, the first and/or second gate electrodes 130a and 130b may further include a diffusion barrier layer, and for example, the diffusion barrier layer may include tungsten nitride (WN), tantalum nitride (TaN), and/or titanium nitride. (TiN) and/or a combination thereof.

The first interlayer insulating layers 120a may be disposed between the first gate electrodes 130a. The second interlayer insulating layers 120b may be disposed between the second gate electrodes 130b. Similarly to the first gate electrodes 130a, the first interlayer insulating layers 120a may be spaced apart from each other in a direction perpendicular to the upper surface of the second substrate 101 and may extend in the x direction. Similarly to the second gate electrodes 130b, the second interlayer insulating layers 120b may be spaced apart from each other in a direction perpendicular to the upper surface of the capping insulating layer 125 and may extend in the x direction. The first and/or second interlayer insulating layers 120a and 120b may include an insulating material such as silicon oxide and/or silicon nitride.

The first and second stack structures GS1 and GS2 may be stacked in order on the second substrate 101 in the z direction. The second stack structure GS2 may be disposed on the first stack structure GS1. The first stack structure GS1 may include first gate electrodes 130a and first interlayer insulating layers 120a alternately stacked. The second stack structure GS2 may include second gate electrodes 130b and second interlayer insulating layers 120b alternately stacked.

The first stack structure GS1 may include a first lower staircase region STL1, a second lower staircase region STL2, and/or a third lower staircase region STL3 in the second region R2. The second stack structure GS2 may include a first upper staircase region STU1, a second upper staircase region STU2, a third upper staircase region STU3, and/or at least one through portion PP1, PP2, and/or PP3 in the second region R2.

The first to third lower staircase regions STL1, STL2, and/or STL3 may be stacked in order and spaced apart from each other in a direction from the first region R1 toward the second region R2, in the x direction, for example. The first to third upper staircase regions STU1, STU2, and/or STU3 may be stacked in order and spaced apart from each other in the direction from the first region R1 to the second region R2, in the x direction, for example. The first to third upper staircase regions STU1, STU2, and/or STU3 may be disposed between the channel structures CH and the first to third lower staircase regions STL1, STL2, and/or STL3 in the x direction. The first to third upper staircase regions STU1, STU2, and/or STU3 and the first to third lower staircase regions STL1, STL2, and/or STL3 may be stacked in order and spaced apart from each other in the x direction. The first to third upper staircase regions STU1, STU2, and/or STU3 may be disposed between the channel structures CH and the through portions PP1, PP2, and/or PP3 in the x direction.

The first and/or second stack structures GS1 and GS2 may have first gate electrodes 130a and/or second gate electrodes 130b corresponding to each other in the second region R2. As described with reference to FIGS. 9C to 9F, the first to third lower staircase regions STL1, STL2, and/or STL3 may be formed in the same process of forming the first to third upper staircase regions STU1, STU2 and STU3, respectively, such that a shape or profile of the first gate electrodes 130a of the first to third lower staircase regions STL1, STL2, and/or STL3 may match a shape or profile of the second gate electrodes 130b of the first to third upper staircase regions STU1, STU2, and/or STU3. The first lower staircase region STL1 may have substantially the same shape as that of the first upper staircase region STU1. The second lower staircase region STL2 may have substantially the same shape as that of the second upper staircase region STU2. The third lower staircase region STL3 may have substantially the same shape as that of the third upper staircase region STU3. In this description, substantially the same shape or a corresponding shape may indicate that the number of the gate electrodes forming the staircase shape, the degree of inclination of each, or one or more, of the staircase region and/or the dummy region, the width of the lower gate electrode of which an upper surface is exposed by the upper gate electrode, the profile of the gate electrodes, and/or the depth of each region may be substantially the same.

The second lower staircase region STL2 may be disposed more adjacent to the second substrate 101 than the first lower staircase region STL1, and/or the third lower staircase region STL3 may be disposed more adjacent to the second substrate 101 than the second lower staircase region STL2. The second upper staircase region STU2 may be disposed more adjacent to the second substrate 101 than the first upper staircase region STU1, and/or the third upper staircase region STU3 may be disposed more adjacent to the second substrate 101 than the third upper staircase region STU3.

Each, or one or more, of the first to third upper staircase regions STU1, STU2, and/or STU3 and/or the first to third lower staircase regions STL1, STL2, and/or STL3 may include a pad region PD and/or a dummy region DM opposing the pad region PD.

In the pad region PD of each, or one or more, of the first to third lower staircase regions STL1, STL2, and/or STL3, the first gate electrodes 130a may extend further than the upper first gate electrode 130a and may be connected to each, or one or more, of the contact plugs 170. In the pad region PD of each, or one or more, of the first to third upper staircase regions STU1, STU2, and/or STU3, the second gate electrodes 130b may extend further than the upper second gate electrode 130b and may be connected to each, or one or more, of the contact plugs 170. The pad region PD of each, or one or more, of the first to third lower staircase regions STL1, STL2, and/or STL3 and the first to third upper staircase regions STU1, STU2 and/or STU3 may have a height which may decrease in a direction of being further away from the first region R1, and for example, a maximum height thereof may decrease. In example embodiments, the number of steps in the pad region PD and/or the dummy region DM of each, or one or more, of the first to third upper staircase regions STU1, STU2 and/or STU3 and the first to third lower staircase regions STL1, STL2 and/or STL3 may be varied. In each, or one or more, of the pad region PD and/or the dummy region DM, widths of the ends of the gate structures may be the same, but an example embodiment thereof is not limited thereto. For example, widths of the ends of the gate structures in the pad region PD may be different from each other.

A depth of the first upper staircase region STU1 may be substantially the same as a depth of the first lower staircase region STL1. A depth of the second upper staircase region STU2 may be substantially the same as a depth of the second lower staircase region STL2. A depth of the third upper staircase region STU3 may be substantially the same as a depth of the third lower staircase region STL3. In this description, the depth of the upper staircase regions STU1, STU2, and/or STU3 may refer to a distance from an upper surface of the second stack structure GS2 to a lowermost second gate electrode 130b of which an upper surface is exposed in the upper staircase regions STU1, STU2, and/or STU3. Also, the depth of the lower staircase regions STL1, STL2, and/or STL3 may refer to a distance from an upper surface of the first stack structure GS1 to a lowermost first gate electrode 130a of which an upper surface is exposed in the lower staircase regions STL1, STL2, and/or STL3.

The pad region PD and the dummy region DM may have different inclinations. For example, the pad region PD may have a first slope, and the dummy region DM may have a second slope greater than the first slope. However, in example embodiments, the inclinations of the pad region PD and the dummy region DM may be the same.

The pad region PD of the first lower staircase region STL1 and the pad region PD of the first upper staircase region STU1 may have substantially the same slope, and the dummy region DM of the first lower staircase region STL1 and the dummy region DM of the first upper staircase region STU1 may have substantially the same slope. For example, the pad region PD of the first lower staircase region STL1 and the pad region PD of the first upper staircase region STU1 may have the first slope, and the dummy region DM of the first lower staircase region STL1 and the dummy region DM of the first upper staircase region STU1 may have a second slope equal to or greater than the first slope. The pad region PD of the second lower staircase region STL2 and the pad region PD of the second upper staircase region STU2 may have substantially the same slope, and the dummy region DM of the second lower staircase region STL2 and the dummy region DM of the second upper staircase region STU2 may have substantially the same slope. The pad region PD of the third lower staircase region STL3 and the pad region PD of the third upper staircase region STU3 may have substantially the same slope, and the dummy region DM of the third lower staircase region STL3 and the dummy region DM of the third upper staircase region STU3 may have substantially the same slope. However, in the first to third lower staircase regions STL1, STL2, and/or STL3, the inclinations of the pad regions PD may be substantially the same or different from each other. The inclinations of the pad regions PD in the first to third upper staircase regions STU1, STU2, and/or STU3 may be substantially the same as or different from each other. For example, the pad region PD of the first lower staircase region STL1 and the pad region PD of the first upper staircase region STU1 may have the first slope, and the pad region of the second lower staircase region STU1 may have the same slope as the first slope or may have a slope different from the first slope.

In the example embodiment, three lower staircase regions and three upper staircase regions are provided, but an example embodiment thereof is not limited thereto, and the number of each, or one or more, of the lower staircase regions and/or the upper staircase regions may be varied in example embodiments.

The through portions PP1, PP2, and/or PP3 may penetrate the second stack structure GS2 and may be disposed on the first to third lower staircase regions STL1, STL2, and/or STL3. At least one or more through portions PP1, PP2, and/or PP3 may be disposed to overlap the first to third lower staircase regions STL1, STL2, and/or STL3 in a direction perpendicular to the upper surface of the second substrate 101, in the z direction, for example. The through portions PP1, PP2, and/or PP3 may penetrate the second stack structure GS2 and the capping insulating layer 125 and may be connected to the first to third lower staircase regions STL1, STL2, and/or STL3. The through portions PP1, PP2, and/or PP3 may have a first width on a lower end and may have a second width greater than the first width on an upper end. At least one side surface of the through portions PP1, PP2, and/or PP3 may have an inclination in one direction. At least one side surface of the through portions PP1, PP2, and/or PP3 may have a continuous inclination to the first to third lower staircase regions STL1, STL2, and/or STL3. At least one side surface of the through portions PP1, PP2, and/or PP3 may have a constant inclination. At least one side surface of the through portions PP1, PP2, and/or PP3 may not be intermittent, and may have a continuous inclination. In the example embodiment, the pad region PD of each, or one or more, of the first lower staircase regions to the third lower staircase regions STL1, STL2, and/or STL3 may have a first slope, the dummy region DM of each, or one or more, of the first to third lower staircase regions STL1, STL2, and/or STL3 may have a second slope greater than the first slope, and the side surfaces of the through portions PP1, PP2, and/or PP3 may have a third slope greater than the first slope and the second slope.

In an example embodiment, the through portions PP1, PP2, and/or PP3 may include a first through portion PP1 connected to the first lower staircase region STL1, a second through portion PP2 connected to the second lower staircase region STL2, and/or a third through portion PP3 connected to the third lower staircase region STL3. The first through portion PP1, the second through portion PP2, and/or the third through portion PP3 may be spaced apart from each other in the x direction.

The semiconductor device 100 may further include first protrusions HR1 disposed between the first upper staircase region STU1 and the second upper staircase region STU2, between the second upper staircase region STU2 and the third upper staircase region STU3, and/or between the third upper staircase region STU3 and the first through portion PP1. The semiconductor device 100 may further include second protrusions HR2 disposed between the first lower staircase region STL1 and the second lower staircase region STL2 and/or between the second lower staircase region STL2 and the third lower staircase region STL3. Upper surfaces of the first protrusions HR1 may be disposed on substantially the same level as a level of the upper surface of the uppermost second gate electrode 130*b* among the second gate electrodes 130*b* in the first region R1. In an example embodiment, upper surfaces of the first protrusions HR1 and upper surfaces of the second protrusions HR2 may be disposed on substantially the same level. For example, upper surfaces of the second protrusions HR2 may be disposed on substantially the same level as a level of the upper surface of the uppermost second gate electrode 130*b* among the second gate electrodes 130*b* in the first region R1. In an example embodiment, the second protrusions HR2 may be disposed between the through portions PP1, PP2, and/or PP3. For example, the second protrusions HR2 may be disposed between the first through portion PP1 and the second through portion PP2 and/or between the second through portion PP2 and the third through portion PP3.

The separation regions MS may be disposed to penetrate the first and/or second gate electrodes 130*a* and 130*b* and to extend in the x direction in the first region R1 and the second region R2. As illustrated in FIG. 1, the separation regions MS may be disposed parallel to each other. A portion of the separation regions MS may extend as an integrated single region along the first region R1 and/or the second region R2, and the other portion may extend only to a portion of the second region R2, and/or may be disposed intermittently in the first region R1 and/or the second region R2. However, in example embodiments, the arrangement order and the arrangement gap of the separation regions MS may be varied. As illustrated in FIG. 2C, the separation regions MS may penetrate the entire first and/or second gate electrodes 130*a* and 130*b* stacked on the second substrate 101 and may be connected to the second substrate 101. A separation insulating layer 106 may be disposed in the separation regions MS.

The upper separation regions SS may extend in the x direction between the separation regions MS. The upper separation regions SS may be disposed in a portion of the second region R2 and/or the first region R1 to penetrate a portion of the second gate electrodes 130*b* including the uppermost second gate electrode 130*b* among the second gate electrodes 130*b*. As illustrated in FIG. 2C, the upper separation regions SS may separate three second gate electrodes 130*b* from each other in the y direction, for example. However, the number of the second gate electrodes 130*b* separated by the upper separation regions SS may be varied in example embodiments. The upper separation regions SS may include an upper separation insulating layer 103.

Each, or one or more, of the channel structures CH may form a single memory cell string, and may be spaced apart from each other while forming rows and columns on the first region R1. The channel structures CH may be disposed to form a grid pattern in the x-y plane or may be disposed in a zigzag shape in one direction. The channel structures CH may have a columnar shape, and may have an inclined side surface having a width decreasing toward the second substrate 101 depending on an aspect ratio. In example embodiments, the channel structures CH disposed adjacent to the end of the first region R1 may be dummy channels which do not substantially form a memory cell string.

The channel structures CH may include vertically stacked first and second channel structures CH1 and CH2. The channel structures CH may have a form in which the first channel structures CH1 penetrating the first stack structure GS1 and the second channel structures CH2 penetrating the second stack structure GS2 may be connected to each other, and may have a bent portion due to a difference in width in the connection region. In an example embodiment, the first channel structures CH1 may also penetrate the capping insulating layer 125. In an example embodiment, the channel structures CH may have a bent portion due to a difference in width between the first stack structure GS1 and the second stack structure GS2. However, in example embodiments, the number of channel structures stacked in the z direction may be varied.

Each, or one or more, of the channel structures CH may include a channel layer 140, a gate dielectric layer 145, a channel filling insulating layer 147, and/or a channel pad 149 disposed in the channel hole. As illustrated in the enlarged diagram in FIG. 2C, the channel layer 140 may be formed in an annular shape surrounding the channel filling insulating layer 147 therein, but in example embodiments, the channel layer 140 may have a columnar shape such as a cylindrical shape or a prism shape without the channel filling insulating layer 147. The channel layer 140 may be connected to the first horizontal conductive layer 102 in a lower portion. The channel layer 140 may include a semiconductor material such as polycrystalline silicon and/or single crystal silicon.

The gate dielectric layer 145 may be disposed between the first and second gate electrodes 130*a* and 130*b* and the channel layer 140. Although not illustrated in detail, the gate dielectric layer 145 may include a tunneling layer, a charge storage layer, and/or a blocking layer stacked in order from the channel layer 140. The tunneling layer may tunnel charges into the charge storage layer, and may include, for example, silicon oxide ($SiO_2$), silicon nitride ($Si_3N_4$), and/or silicon oxynitride (SiON), and/or a combination thereof. The charge storage layer may be a charge trap layer and/or a floating gate conductive layer. The blocking layer may include silicon oxide ($SiO_2$), silicon nitride ($Si_3N_4$), silicon oxynitride (SiON), and/or a high-k dielectric material, and/or a combination thereof. In example embodiments, at least a portion of the gate dielectric layer 145 may extend in a horizontal direction along the first and/or second gate electrodes 130*a* and 130*b*.

The channel pad 149 may only be disposed on the upper end of the upper second channel structure CH2. The channel pad 149 may include, for example, doped polycrystalline silicon.

The channel layer 140, the gate dielectric layer 145, and/or the channel filling insulating layer 147 may be connected to each other between the first channel structure CH1 and the second channel structure CH2.

A capping insulating layer 125 having a relatively greater thickness may be disposed between the first channel structure CH1 and the second channel structure CH2, that is, between the first and second stack structures GS1 and GS2.

A thickness of the capping insulating layer 125 may be greater than a thickness of each, or one or more, of the first interlayer insulating layers 120a and/or a thickness of each, or one or more, of the second interlayer insulating layers 120a and/or 120b. The capping insulating layer 125 may include, for example, oxide and/or nitride. In example embodiments, an etch stop layer may be further included on a lower portion or an upper portion of the capping insulating layer 125.

The cell region insulating layer 190 may cover the first stack structure GS1 and/or the second stack structure GS2. In example embodiments, the cell region insulating layer 190 may include a plurality of insulating layers. The cell region insulating layer 190 may be formed of an insulating material.

As illustrated in FIG. 2B, the contact plugs 170 may be formed vertically in the z direction and may have a cylindrical shape. The contact plugs 170 may be connected to the first and/or second gate electrodes 130a and 130b in the second region R2. The contact plugs 170 may be connected to the first gate electrodes 130a in the pad region PD of each, or one or more, of the first to third lower staircase regions STL1, STL2, and/or STL3. The contact plugs 170 may be connected to the second gate electrodes 130b in the pad region PD of each, or one or more, of the first to third upper staircase regions STU1, STU2, and/or STU3. The contact plugs 170 may include a conductive material, such as, for example, tungsten (W), copper (Cu), and/or aluminum (Al), and/or the like, and each, or one or more, element may further include a diffusion barrier layer. In example embodiments, the semiconductor device 100 may further include dummy structures disposed adjacent to each, or one or more, of the contact plugs 170 and penetrating the first and second gate electrodes 130a and 130b.

The upper contacts 185 may form a portion of an upper wiring structure electrically connected to memory cells in the memory cell region CELL. The upper contacts 185 may be connected to the channel structures CH and/or the contact plugs 170. The semiconductor device 100 may further include wiring lines and contacts connected to the upper contacts 185. In example embodiments, the number and arrangement of contacts and/or wiring lines forming the upper wiring structure may be varied. The upper contacts 185 may include a metal, such as, for example, tungsten (W), copper (Cu), and/or aluminum (Al), and/or the like.

In the description below, the overlapping descriptions described with reference to FIGS. 1 to 2C will not be provided.

Figure 3:
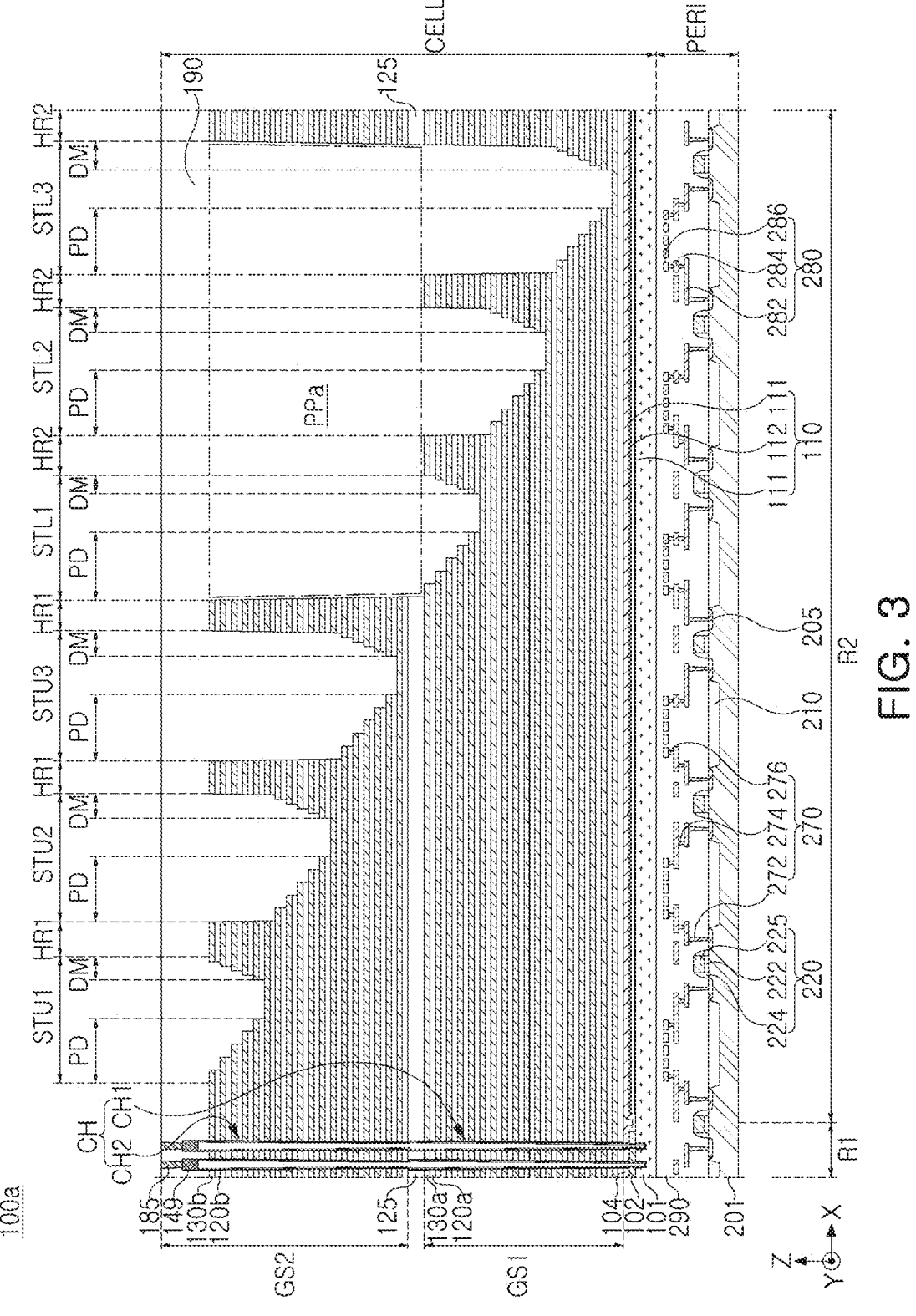
FIG. 3 is a schematic cross-sectional view of a semiconductor device according to an example embodiment.

FIG. 3 is a schematic cross-sectional view of a semiconductor device according to an example embodiment, illustrating a cross-sectional view corresponding to FIG. 2A.

Referring to FIG. 3, a semiconductor device 100a may have a structure in which a through portion PPa and the second protrusion HR2 are different from those in the example embodiment in FIG. 2A.

The through portion PPa may penetrate the second stack structure GS2 and may be disposed on the first to third lower staircase regions STL1, STL2, and/or STL3. The through portion PPa may penetrate the second stack structure GS2 and/or the capping insulating layer 125 and may be connected to the first to third lower staircase regions STL1, STL2, and/or STL3. The through portion PPa may have a first width on a lower end and may have a second width greater than the first width on an upper end. At least one side surface of the through portion PPa may have an inclination in one direction. The through portion PPa may have a continuous inclination to the first to third lower staircase regions STL1, STL2, and/or STL3.

The second stack structure GS2 may include a single through portion PPa penetrating the second stack structure GS2. In other words, the through portion PPa may be connected as an integrated portion on the first to third lower staircase regions STL1, STL2, and/or STL3. In an example embodiment, the through portion PPa may be disposed on each, or one or more, of the first to third lower staircase regions STL1, STL2, and/or STL3 and the second protrusions HR2. The through portion PPa may be disposed to overlap the first to third lower staircase regions STL1, STL2, and/or STL3 and the second protrusions HR2 in the z direction. The through portion PPa in the example embodiment may be formed by etching to penetrate the second stack structure GS2 in a single region, rather than by etching to penetrate the second stack structure GS2 in a plurality of regions, in the process of forming the through portion described with reference to FIG. 9C.

In an example embodiment, upper surfaces of the second protrusions HR2 may be disposed on a level lower than a level of upper surfaces of the first protrusions HR1. Upper surfaces of the second protrusions HR2 may be disposed on a level lower than a level of the upper surface of the uppermost second gate electrode 130b among the second gate electrodes 130b in the first region R1. In an example embodiment, the second protrusions HR2 may be disposed on substantially the same level as a level of the upper surface of the uppermost gate electrode 130a among the first gate electrodes 130a.

Figure 4:
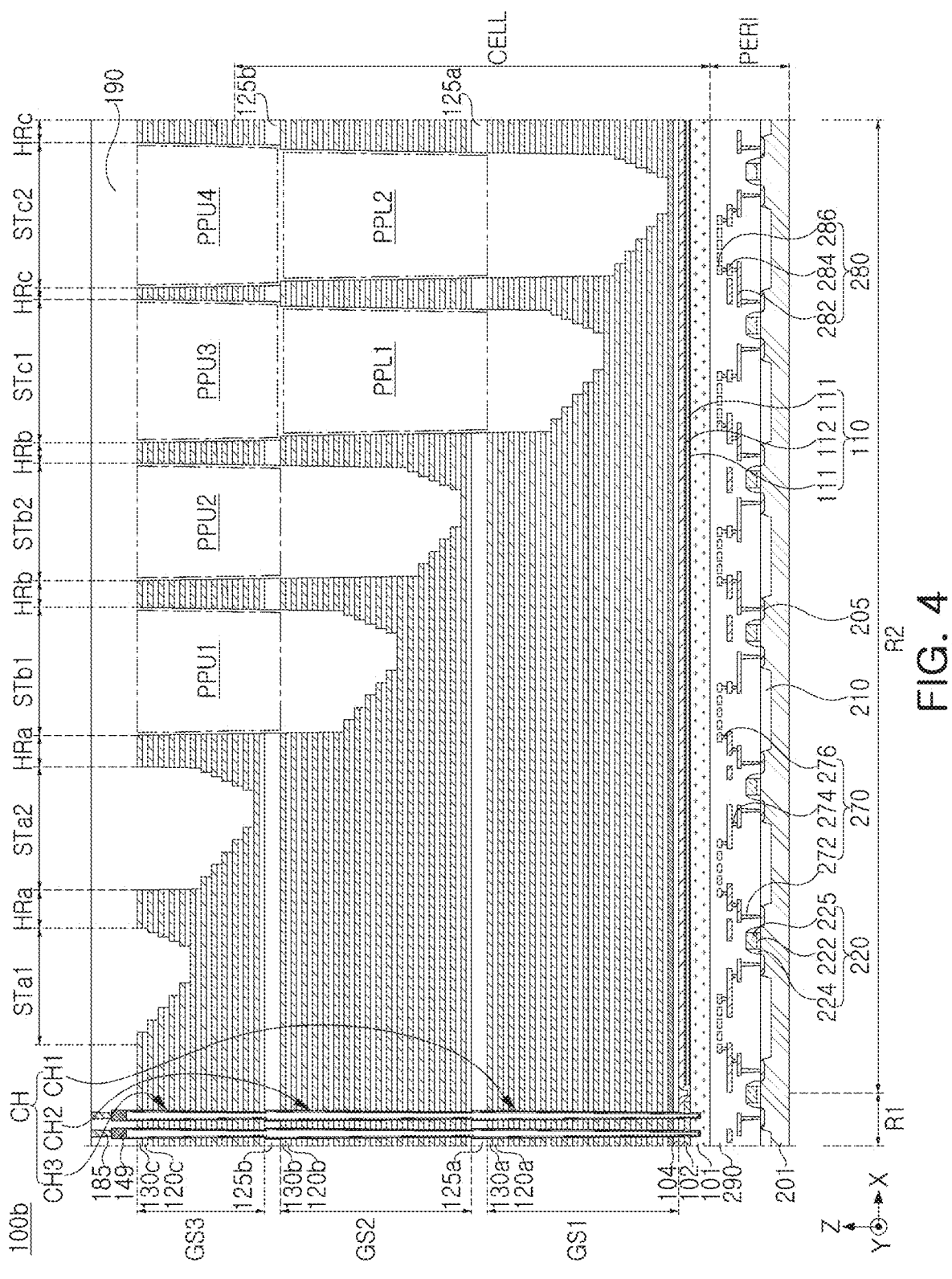
FIG. 4 is a schematic cross-sectional view of a semiconductor device according to an example embodiment.

FIG. 4 is a schematic cross-sectional view of a semiconductor device according to an example embodiment, illustrating a cross-sectional view corresponding to FIG. 2A.

Referring to FIG. 4, in a semiconductor device 100b, the memory cell region CELL may include a first stack structure GS1 disposed on a second substrate 101, a first capping insulating layer 125a disposed on the first stack structure GS1, a second stack structure GS2 disposed on the first capping insulating layer 125a, a second capping insulating layer 125b disposed on the second stack structure GS2, a third stack structure GS3 disposed on the second capping insulating layer 125b, and/or channel structures CH disposed to penetrate the first to third stack structures GS1, GS2, and/or GS3. Differently from the example embodiment in FIGS. 1 to 2C, the semiconductor device 100b may further include a third stack structure GS3. The first to third stack structures GS1, GS2, and/or GS3 may be stacked in order on the second substrate 101 in the z direction.

The first and second capping insulating layers 125a and 125b may have thicknesses greater than thicknesses of the first interlayer insulating layers 120a, the second interlayer insulating layers 120b, and/or the third interlayer insulating layers 120c.

The third stack structure GS3 may include third gate electrodes 130c alternately stacked to be spaced apart from each other on the second capping insulating layer 125b, and/or third interlayer insulating layers 130b alternately stacked with the third gate electrodes 130c.

The first stack structure GS1 may include a first lower staircase region STc1 and/or a second lower staircase region STc2 in the second region R2. The second stack structure GS2 may include a first intermediate staircase region STb1 and/or a second intermediate staircase region STb2 and/or at least one lower through portion PPL1 and/or PPL2 in the second region R2. The third stack structure GS3 may include a first upper staircase region STa1, a second upper staircase region STa2, and/or at least one upper through portion PPU1, PPU2, PPU3, and/or PPU4 in the second region R2.

The first and/or second upper staircase regions STc1 and STc2, the first and/or second intermediate staircase regions STb1 and STb2, and/or the first and/or second lower staircase regions STc1 and STc2 may be disposed in order and spaced apart from each other in a direction from the first region R1 to the second region R2, such as, for example, in the x direction.

The first lower staircase region STc1 may have substantially the same shape as those of the first intermediate staircase region STb1 and/or the first upper staircase region STa1. The second lower staircase region STc2 may have substantially the same shape as those of the second intermediate staircase region STb2 and/or the second upper staircase region STc2.

The second lower staircase region STc2 may be disposed more adjacent to the second substrate 101 than the first lower staircase region STc1. The second intermediate staircase region STb2 may be disposed more adjacent to the second substrate 101 than the first lower staircase region STb1. The second upper staircase region STa2 may be disposed more adjacent to the second substrate 101 than the first upper staircase region STa1.

Each, or one or more, of the first and/or second upper staircase regions STa1 and STa2, the first and/or second intermediate staircase regions STb1 and STb2, and/or the first and/or second lower staircase regions STc1 and STc2 may include a pad region PD and/or a dummy region DM opposing the pad region PD.

In the example embodiment, two lower staircase regions, two intermediate staircase regions and two upper staircase regions, having the pad region and the dummy region, are illustrated, but an example embodiment thereof is not limited thereto. The number of the lower staircase regions, the number of the intermediate staircase regions and/or the number of the upper staircase regions may be varied in example embodiments.

The upper through portions PPU1, PPU2, PPU3, and/or PPU4 may penetrate the third stack structure GS3 and may be disposed on the first and/or second intermediate staircase regions STb1 and Sb2 and/or the first and/or second lower staircase regions STc1 and STc2. The upper through portions PPU1, PPU2, PPU3, and/or PPU4 may be disposed to overlap the first and/or second intermediate staircase regions STb1 and Sb2 and/or the first and/or second lower staircase regions STc1 and STc2 in the z direction.

The lower through portions PPL1 and/or PPL2 may penetrate the second stack structure GS2 and may be disposed on the first and/or second lower staircase regions STc1 and STc2. The lower through portions PPL1 and/or PPL2 may be disposed to overlap the first and/or second lower staircase regions STc1 and STc2 in the z direction.

In an example embodiment, the upper through portions PPU1, PPU2, PPU3, and/or PPU4 may include a first upper through portion PPU1 connected to the first intermediate staircase region STb1, a second upper through portion PPU2 connected to the second intermediate staircase region STb2, a third upper through portion PPU3 connected to the first lower through portion PPL1, and/or a fourth upper through portion PPU4 connected to the second lower through portion PPL2. The first to fourth upper through portions PPU1, PPU2, PPU3, and/or PPU4 may be spaced apart from each other in the x direction.

In an example embodiment, the lower through portions PPL1 and/or PPL2 may be a plurality of lower through portions including a first lower through portion PPL1 connected to the first lower staircase region STc1 and/or a second lower through portion PPL1 connected to the second lower staircase region STc2. The first and/or second lower through portions PPL1 and PPL2 may be spaced apart from each other in the x direction. The first lower through portion PPL1 may be disposed between the third upper through portion PPU3 and the first lower staircase region STc1 in the z direction. The second lower through portion PP2 may be disposed between the fourth upper through portion PPU4 and the second lower staircase region STc2 in the z direction. In an example embodiment, a minimum width of the third upper through portion PPU3 may be greater than a maximum width of the first lower through portion PPL1, but an example embodiment thereof is not limited thereto. For example, the third upper through portion PPU3 and the first lower through portion PPL1 may be connected to each other without a stepped difference. In an example embodiment, a minimum width of the fourth upper through portion PPU4 may be greater than a maximum width of the second lower through portion PPL2, but an example embodiment thereof is not limited thereto.

The semiconductor device 100b may include a first protrusion HRa disposed between the first upper staircase region STa1 and the second upper staircase region STa2, a second protrusion HRb disposed between the first intermediate staircase region STb1 and the second intermediate staircase region STb2, and/or a third protrusion HRc disposed between the first lower staircase region STc1 and the second lower staircase region STc2. An upper surface of the first protrusion HRa may be disposed on substantially the same level as a level of an upper surface of an uppermost third gate electrode 130c among the third gate electrodes 130c in the first region R1. In an example embodiment, the upper surface of the first protrusion HRa, the upper surface of the second protrusion HRb, and/or the upper surface of the third protrusion HRc may be disposed on substantially the same level. For example, the upper surface of the second protrusion HRb and the upper surface of the third protrusion HRc may be disposed on substantially the same level as a level of the upper surface of an uppermost third gate electrode 130c among the third gate electrodes 130c in the first region R1. In an example embodiment, the second protrusion HRb may be disposed between the first upper through portion PPU1 and the second upper through portion PPU2. The third protrusion HRc may be disposed between the third upper through portion PPU3 and the fourth upper through portion PPU4, and/or may be disposed between the first lower through portion PPL1 and the second lower through portion PPL2.

Figure 5:
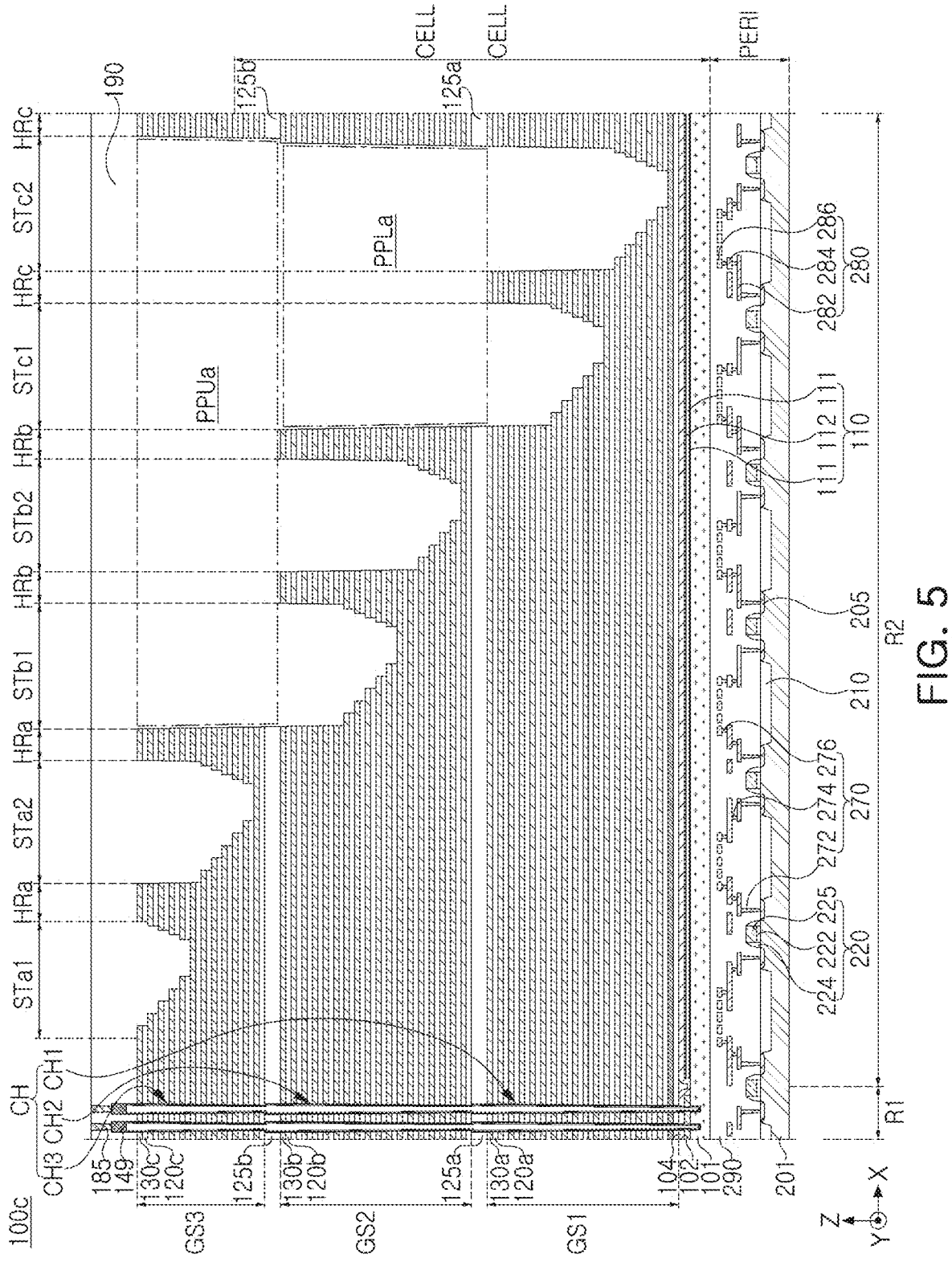
FIG. 5 is a schematic cross-sectional view of a semiconductor device according to an example embodiment.

FIG. 5 is a schematic cross-sectional view of a semiconductor device according to an example embodiment, illustrating a cross-sectional view corresponding to FIG. 2A. In the description below, the overlapping descriptions described with reference to FIG. 4 will not be provided.

Referring to FIG. 5, in the semiconductor device 100c, an upper through portion PPUa, a lower through portion PPLa, a second protrusion HRb, and a third protrusion HRc may have structures different from the example embodiment illustrated in FIG. 4.

The third stack structure GS3 may include a single upper through portion PPUa penetrating the third stack structure GS3. In other words, the upper through portion PPUa may be connected as an integrated portion on the first and second intermediate staircase regions STb1 and/or STb2 and the lower through portion PPLa. The upper through portion PPUa may be disposed on each, or one or more, of the first and/or second intermediate staircase regions STb1 and STb2 and/or the second protrusion HR2.

The second stack structure GS2 may include a single lower through portion PPLa penetrating the second stack structure GS2. In other words, the lower through portion PPLa may be connected as an integrated portion on the first and/or second lower staircase regions STc1 and STc2. The lower through portion PPLa may be disposed on each, or one or more, of the first and/or second lower staircase regions STc1 and STc2 and the third protrusion HR3. The upper through portion PPUa may have a first maximum width, and the lower through portion PPLa may have a second maximum width smaller than the first maximum width, in the x direction.

In an example embodiment, the upper surface of the second protrusion HRb may be disposed on a level lower than a level of the upper surface of the first protrusion HRa. An upper surface of the second protrusion HRb may be disposed on a level lower than a level of an upper surface of an uppermost third gate electrode 130c among the third gate electrodes 130c in the first region R1. In an example embodiment, the second protrusion HRb may be disposed on substantially the same level as a level of the upper surface of the uppermost gate electrode 130b among the second gate electrodes 130b. The upper surface of the third protrusion HRc may be disposed on a level lower than a level of the upper surface of the second protrusion HRb. In an example embodiment, the third protrusion HRc may be disposed on substantially the same level as a level of the upper surface of the uppermost gate electrode 130a among the first gate electrodes 130a.

Figure 6A:
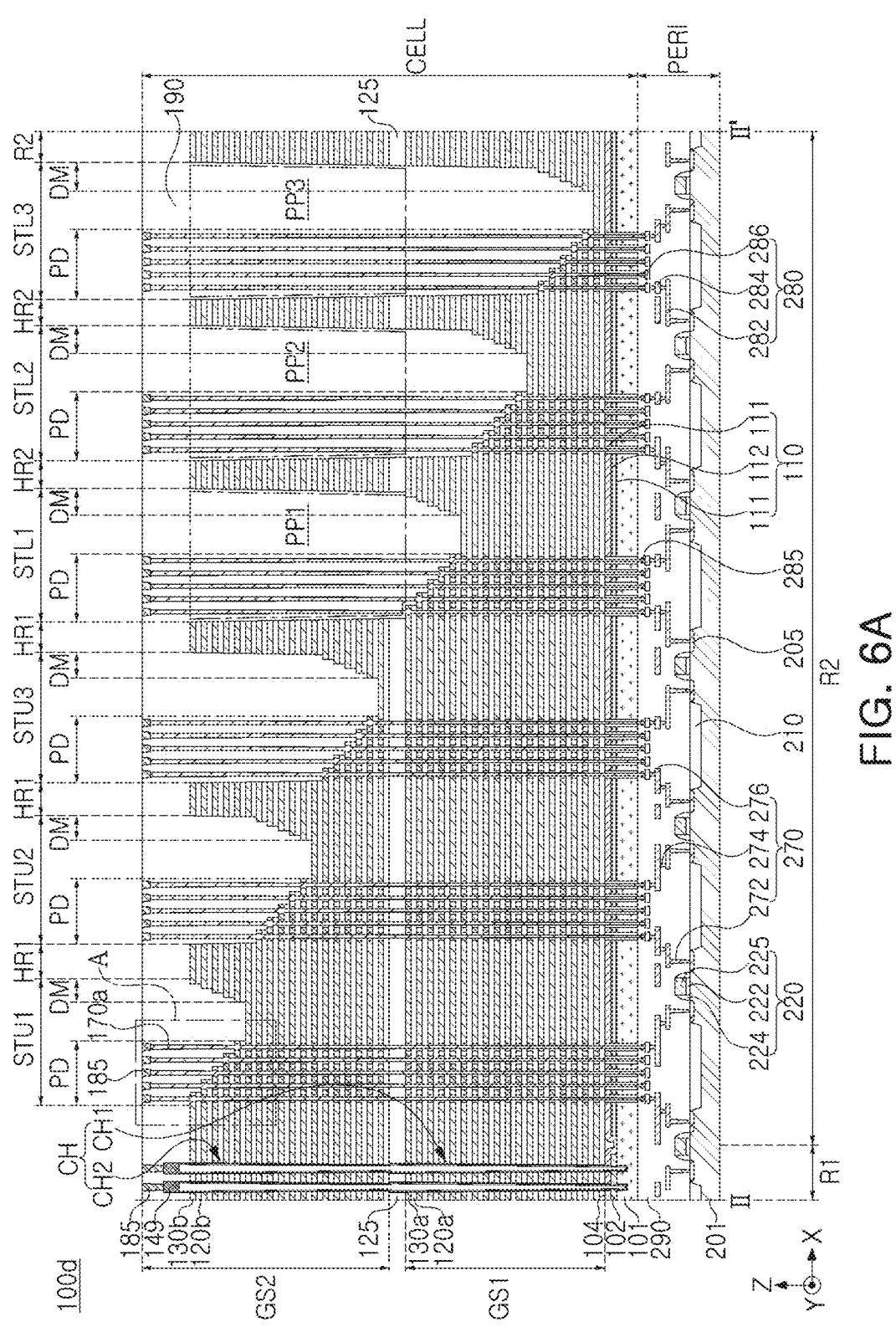
FIG. 6A is a schematic cross-sectional view of a semiconductor device according to an example embodiment.
Figure 6B:
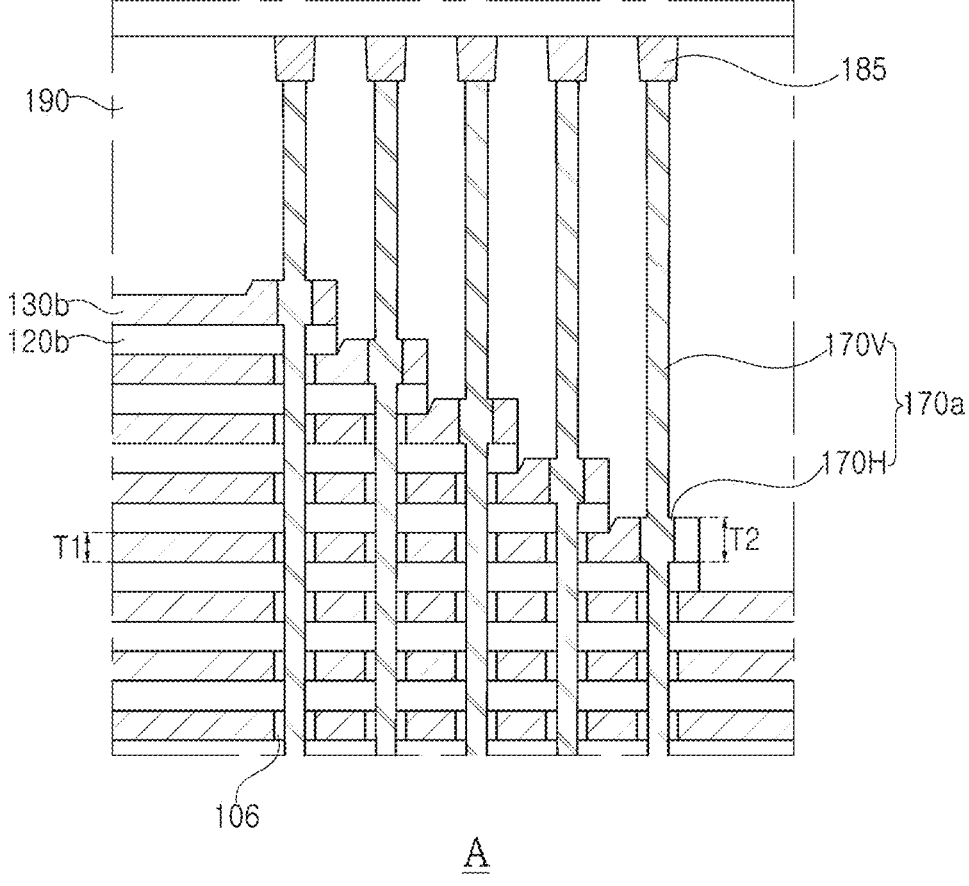
FIG. 6B is a partially enlarged view of a semiconductor device according to an example embodiment.

FIG. 6A is a schematic cross-sectional view of a semiconductor device according to an example embodiment, illustrating a cross-sectional view corresponding to FIG. 2B. FIG. 6B is an enlarged diagram illustrating a portion of a semiconductor device according to an example embodiment, illustrating region "A" in FIG. 6A.

Referring to FIGS. 6A and 6B, in a semiconductor device 100d, a contact plug 170a may have a structure different from the example in FIG. 2B.

The semiconductor device 100d may include contact plugs 170a connected to the first and/or second gate electrodes 130a and 130b of the first and/or second stack structures GS1 and GS2, and/or contact insulating layers 106 surrounding the contact plugs 170a. The contact plugs 170a may penetrate the first and/or second stack structures GS1 and GS2 and may be connected to the lower wiring lines 280 of the peripheral circuit region PERI.

As illustrated in FIGS. 6A and 6B, the first and/or second gate electrodes 130a and 130b may extend to have a first thickness T1 from the first region R1 toward the second region R2. In at least a portion of the pad region PD, an uppermost first gate electrode 130a and/or an uppermost second gate electrode 130b may have a second thickness T2 greater than the first thickness T1.

The contact plugs 170a may penetrate the uppermost gate electrodes 130a and/or 130b and may be connected to the uppermost gate electrodes 130a and/or 130b in the second region R2.

The contact plugs 170a may penetrate the second substrate 101, the second horizontal conductive layer 104, and/or the horizontal insulating layer 110 below the first gate electrodes 130a and may be connected to lower wiring lines 280 in the peripheral circuit region PERI. The contact plugs 170a may be spaced apart from the second substrate 101, the second horizontal conductive layer 104, and/or the horizontal insulating layer 110 by a substrate insulating layer.

As illustrated in FIG. 6B, each, or one or more, of the contact plugs 170a may include a vertical extension portion 170V extending in the z direction and a horizontal extension portion 170H extending horizontally from the vertical extension portion 170V and in contact with the gate electrodes 130a and/or 130b. The vertical extension portion 170V may have a cylindrical shape of which a width decreases toward the second substrate 101 due to an aspect ratio. The horizontal extension portion 170H may be disposed along the circumference of the vertical extension portion 170V.

The contact plugs 170a may be surrounded by a substrate insulating layer and may be electrically separated from the second substrate 101. A region including lower ends of the contact plugs 170a may be surrounded by pad layers (not shown) on the third lower wiring lines 286. The pad layers may be configured to protect the lower wiring lines 280 during the process of manufacturing the semiconductor device 100, and may include a conductive material, such as, for example, polycrystalline silicon.

Figure 7:
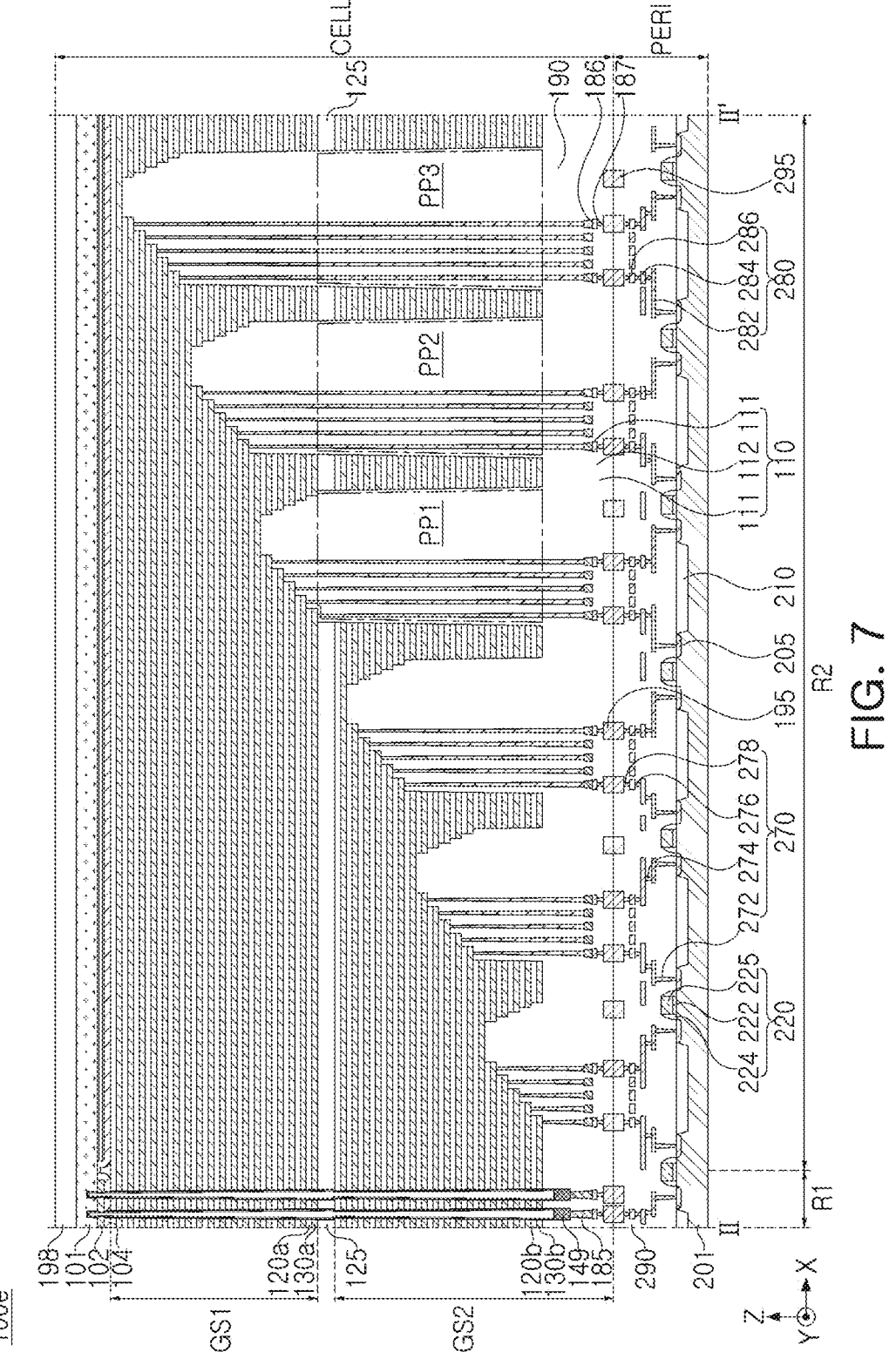
FIG. 7 is a schematic cross-sectional view of a semiconductor device according to an example embodiment.

FIG. 7 is a schematic cross-sectional view of a semiconductor device according to an example embodiment, illustrating a cross-sectional view corresponding to FIG. 2B.

Referring to FIG. 7, a semiconductor device 100e may have a structure in which the peripheral circuit region PERI and the memory cell region CELL are vertically bonded to each other. The peripheral circuit region PERI and the memory cell region CELL may have a structure in which they are vertically bonded. To this end, the peripheral circuit region PERI may further include fourth lower contact plugs 278 and/or first bonding metal layers 295, and/or the memory cell region CELL may further include metal wirings 186, bonding vias 187, second bonding metal layers 195, and/or a passivation layer 198 on the second substrate 101.

The first bonding metal layers 295 may be disposed on the fourth lower contact plugs 278, and upper surfaces of the first bonding metal layers 295 may be exposed to an upper surface of the peripheral circuit region PERI through the peripheral region insulating layer 290. The second bonding metal layers 195 may be disposed below the bonding vias 187, and/or a lower surface of the second bonding metal layer 195 may be exposed to a lower surface of the memory cell region CELL through the cell region insulating layer 190. The first bonding metal layers 295 and/or the second bonding metal layers 195 may include a conductive material, such as, for example, copper (Cu). In example embodiments, each, or one or more, of the peripheral region insulating layer 290 and the cell region insulating layer 190 may further include a bonding dielectric layer surrounding the first bonding metal layers 295 and/or the second bonding metal layers 195, and disposed to have a predetermined (or alternately given) depth from one surface. The bonding dielectric layer may include at least one of SiO, SiN, SiCN, SiOC, SiON, and/or SiOCN, for example. The passivation layer 198 may be disposed on the second substrate 101 to protect the second substrate 101, and may include an insulating material.

The peripheral circuit region PERI and the memory cell region CELL may be bonded to each other by bonding the first bonding metal layers 295 to the second bonding metal layers 195 and/or bonding the bonding dielectric layers to each other. The bonding of the first bonding metal layers 295 to the second bonding metal layers 195 may be, for example, a copper (Cu)-copper (Cu) bonding, and/or the bonding of the bonding dielectric layers may be, for example, dielectric-dielectric bonding such as SiCN—SiCN bonding. The peripheral circuit region PERI and the memory cell region CELL may be bonded to each other by hybrid bonding including copper (Cu)-copper (Cu) bonding and dielectric-dielectric bonding.

Figure 8:
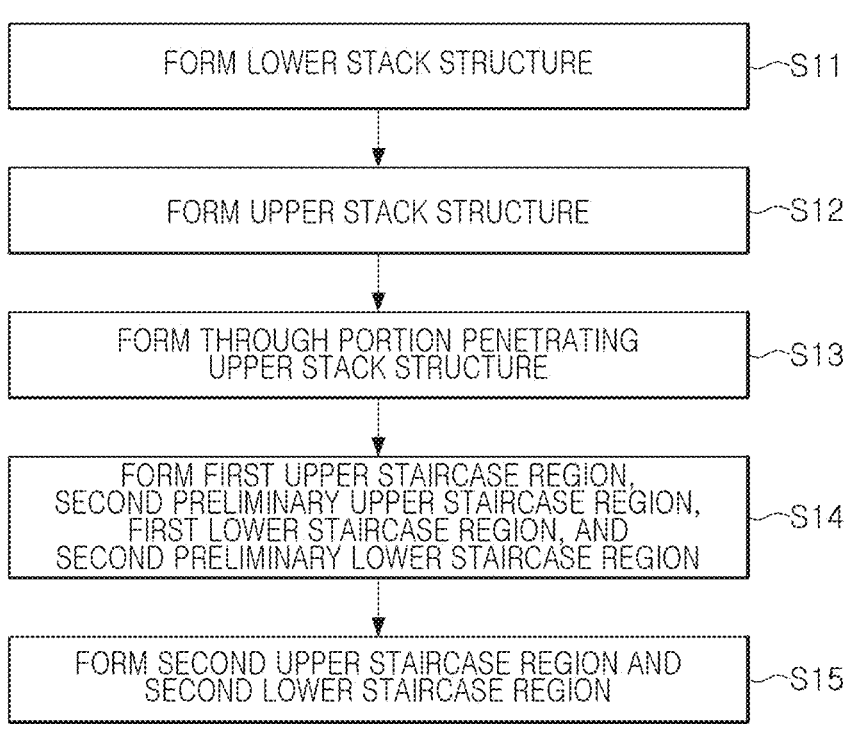
FIG. 8 is a flowchart illustrating a method of manufacturing a semiconductor device according to an example embodiment.

FIG. 8 is a flowchart illustrating a method of manufacturing a semiconductor device according to an example embodiment. FIGS. 9A to 9H are diagrams illustrating processes of a method of manufacturing a semiconductor device in order according to an example embodiment, illustrating an example embodiment of a method of manufacturing the semiconductor device described with reference to FIGS. 1 to 2C. FIGS. 9A to 9H illustrate a manufacturing method on a cross-sectional view corresponding to the cross-sectional view of the semiconductor device in FIG. 2A.

Figure 9A:
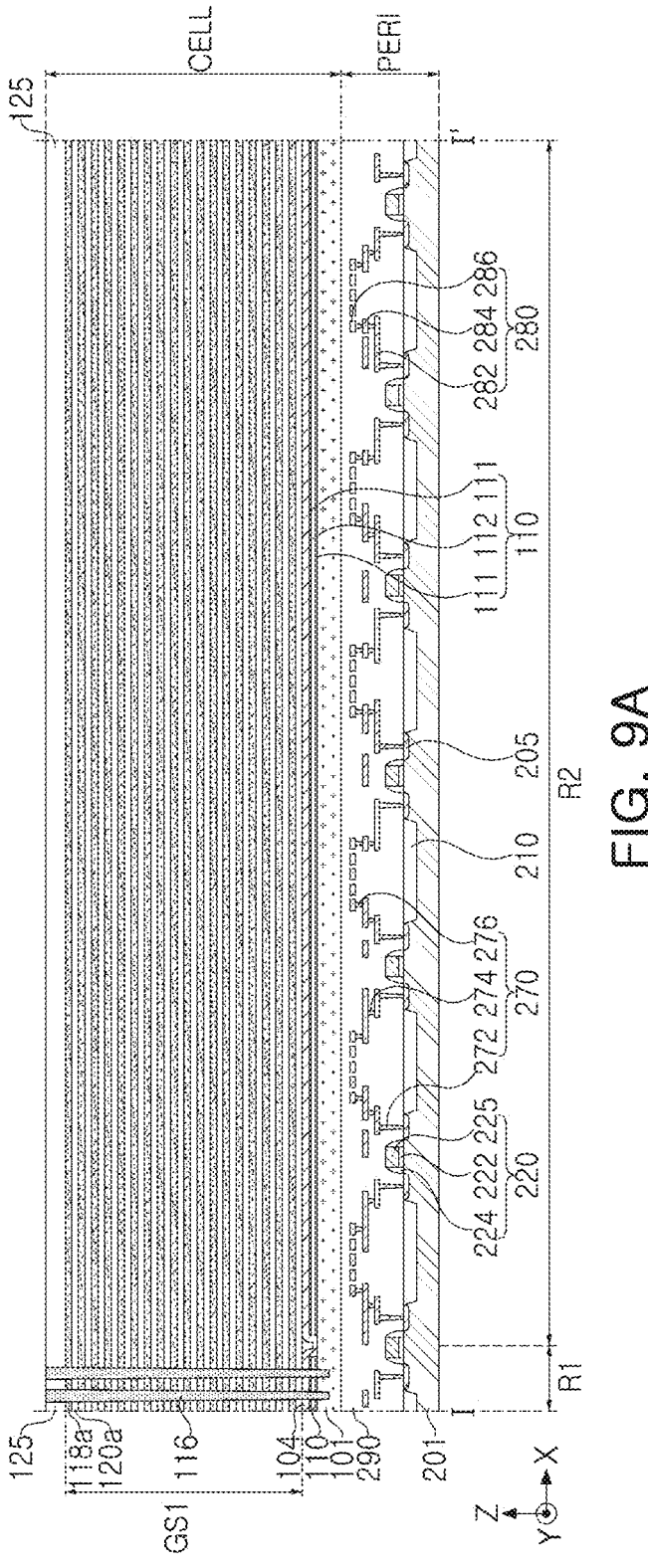
FIGS. 9A to 9H are diagrams illustrating a method of manufacturing a semiconductor device in order according to an example embodiment.

FIGS. 8 and 9A illustrate a process of forming the first stack structure (S11) of the method of manufacturing a semiconductor device (S10). A peripheral circuit region PERI including circuit devices 220 and/or lower wiring structures may be formed on a first substrate 201, and/or a second substrate 101 on which a memory cell region CELL is provided, a horizontal insulating layer 110, a second horizontal conductive layer 104, and/or a first stack structure GS1 in which first sacrificial insulating layer 118a and/or first interlayer insulating layer 120a are alternately stacked may be formed on the peripheral circuit region PERI. A capping insulating layer 125 may be formed on the first stack structure GS1. Next, channel sacrificial layers 116 penetrating the first stack structure GS1 may be formed.

The device isolation layers 210 may be formed in the first substrate 201, and the circuit gate dielectric layer 222 and the circuit gate electrode 225 may be formed in order on the first substrate 201. The device isolation layers 210 may be formed by a shallow trench isolation (STI) process, for example. The circuit gate dielectric layer 222 and the circuit gate electrode 225 may be formed using atomic layer deposition (ALD) and/or chemical vapor deposition (CVD). The circuit gate dielectric layer 222 may be formed of silicon oxide, and/or the circuit gate electrode 225 may be formed of at least one of polycrystalline silicon and/or a metal silicide layer, but an example embodiment thereof is not limited thereto. Next, a spacer layer 224 may be formed on each of both sides of the circuit gate dielectric layer 222 and/or the circuit gate electrode 225. In example embodiments, the spacer layer 224 may include a plurality of layers. Next, impurity regions 205 may be formed by performing an ion implantation process.

The lower contact plugs 270 of the lower wiring structures may be formed by partially forming the peripheral region insulating layer 290, removing a portion thereof by etching, and filling conductive material therein. The lower wiring lines 280 may be formed by depositing a conductive material and patterning the material, for example.

The peripheral region insulating layer 290 may include a plurality of insulating layers. A portion of the peripheral region insulating layer 290 may be formed in each process of forming the lower wiring structures, and a portion thereof may be formed on the uppermost lower wiring line 280, such that the peripheral region insulating layer 290 may be formed to cover the circuit devices 220 and the lower wiring structures.

Next, the second substrate 101 may be formed on the peripheral region insulating layer 290. The second substrate 101 may be formed of polycrystalline silicon, for example, and may be formed by a CVD process. Polycrystalline silicon forming the second substrate 101 may include impurities.

The first and second horizontal insulating layers 111 and 112 forming the horizontal insulating layer 110 may be alternately stacked on the second substrate 101. The horizontal insulating layer 110 may be partially replaced with the first horizontal conductive layer 102 in FIG. 2B through a subsequent process. The first horizontal insulating layers 111 may include a material different from that of the second horizontal insulating layer 112. For example, the first horizontal insulating layers 111 may be formed of the same material as that of the first interlayer insulating layers 120a, and the second horizontal insulating layers 112 may be formed of a material different from that of the first interlayer insulating layers 120a.

The second horizontal conductive layer 104 may be formed on the horizontal insulating layer 110, and may be in contact with the second substrate 101 in a region from which the horizontal insulating layer 110 is removed. Accordingly, the second horizontal conductive layer 104 may be bent along ends of the horizontal insulating layer 110, may cover the ends, and/or may extend to the second substrate 101.

Next, the first sacrificial insulating layers 118a and the first interlayer insulating layer 120a may be alternately stacked on the second horizontal conductive layer 104, thereby forming the first stack structure GS1, and a capping insulating layer 125 having a thickness greater than that of the first interlayer insulating layers 120a may be formed on the first stack structure GS1. The first sacrificial insulating layers 118a may be replaced with the first gate electrodes 130a (see FIG. 2A) through a subsequent process. In example embodiments, an etch stop layer may be further formed on or below the capping insulating layer 125.

The first sacrificial insulating layers 118a may be formed of a material different from that of the first interlayer insulating layers 120a, and may be formed of a material etched with etch selectivity with respect to the first interlayer insulating layers 120a under a predetermined (or alternately given) etch condition. For example, the first interlayer insulating layer 120a and/or the capping insulating layer 125 may be formed of at least one of silicon oxide and/or silicon nitride, and/or the first sacrificial insulating layers 118a may be formed of a material different from that of the first interlayer insulating layer 120a, selected from among silicon, silicon oxide, and/or silicon carbide, and/or silicon nitride. In example embodiments, the thicknesses of the first interlayer insulating layers 120a may not be the same. Also, the thicknesses of the first interlayer insulating layers 120a and/or the first sacrificial insulating layers 118a and/or the number of the layers thereof may be varied from the illustrated examples.

The channel sacrificial layers 116 may be formed by forming lower channel holes to penetrate the first stack structure GS1, and depositing a material forming the channel sacrificial layers 116 in the lower channel holes. The channel sacrificial layers 116 may include, for example, polycrystalline silicon.

Figure 9B:
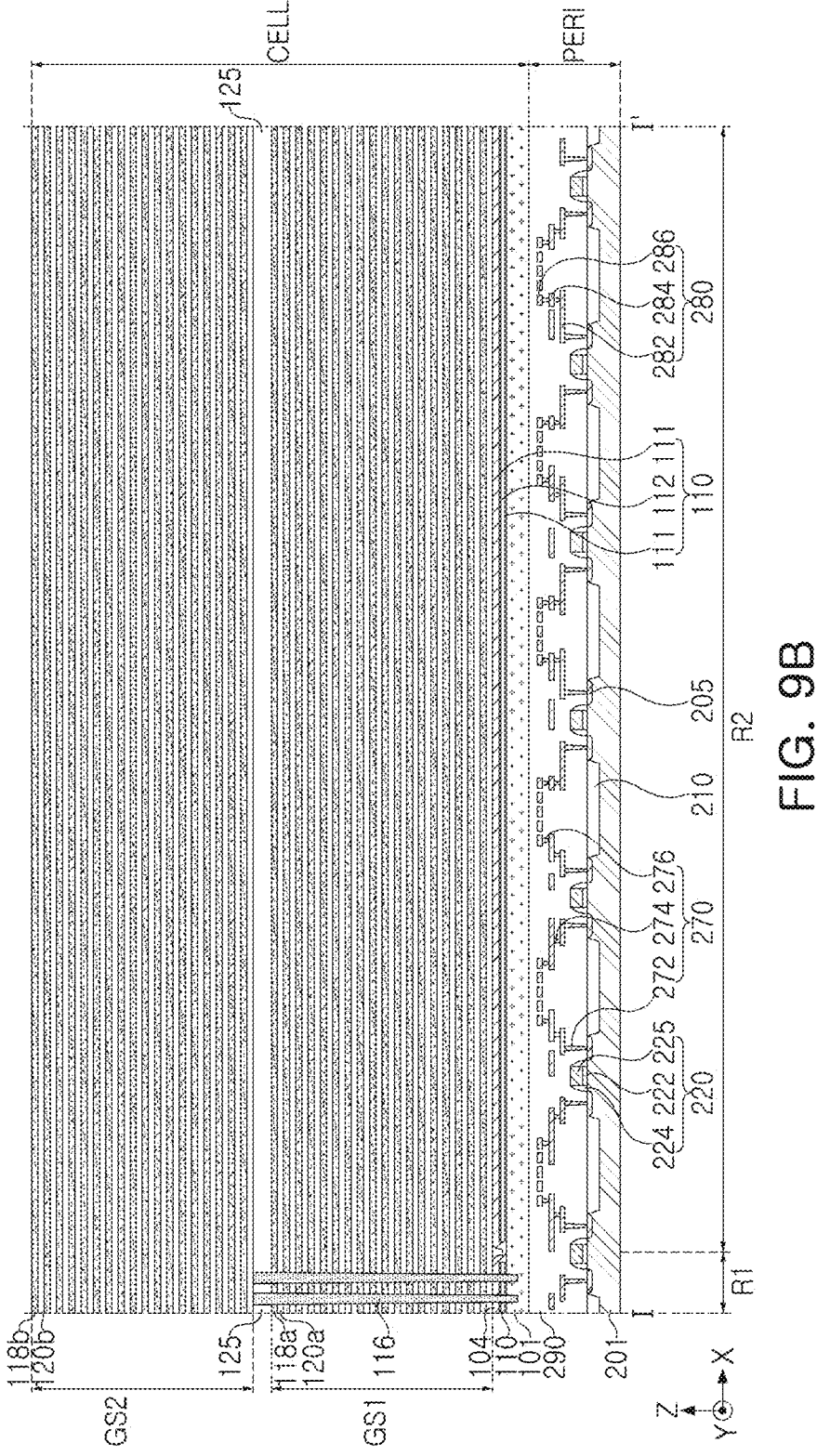

FIGS. 8 and 9B illustrate a process of forming a second stack structure (S12) of the method of manufacturing a semiconductor device (S10). The second stack structure GS2 may be formed on the first stack structure GS1. The second stack structure GS2 in which second sacrificial insulating layers 118b and second interlayer insulating layers 120b are alternately stacked may be formed on the capping insulating layer 125.

The second sacrificial insulating layers 118b may be formed of a material different from that of the second interlayer insulating layers 120b, and may formed of a material etched with etch selectivity with respect to the second interlayer insulating layers 120b under a predetermined (or alternately given) etch condition. The second sacrificial insulating layers 118b may be formed of the same material as that of the first sacrificial insulating layers 118a, and the second interlayer insulating layers 120b may be formed of the same material as that of the first interlayer insulating layers 120a. In example embodiments, the thicknesses of the second interlayer insulating layers 120b may not be the same. Also, the thicknesses of the second interlayer insulating layers 120b and/or the second sacrificial insulating layers 118b and/or the number of layers thereof may be varied from the illustrated examples.

Figure 9C:
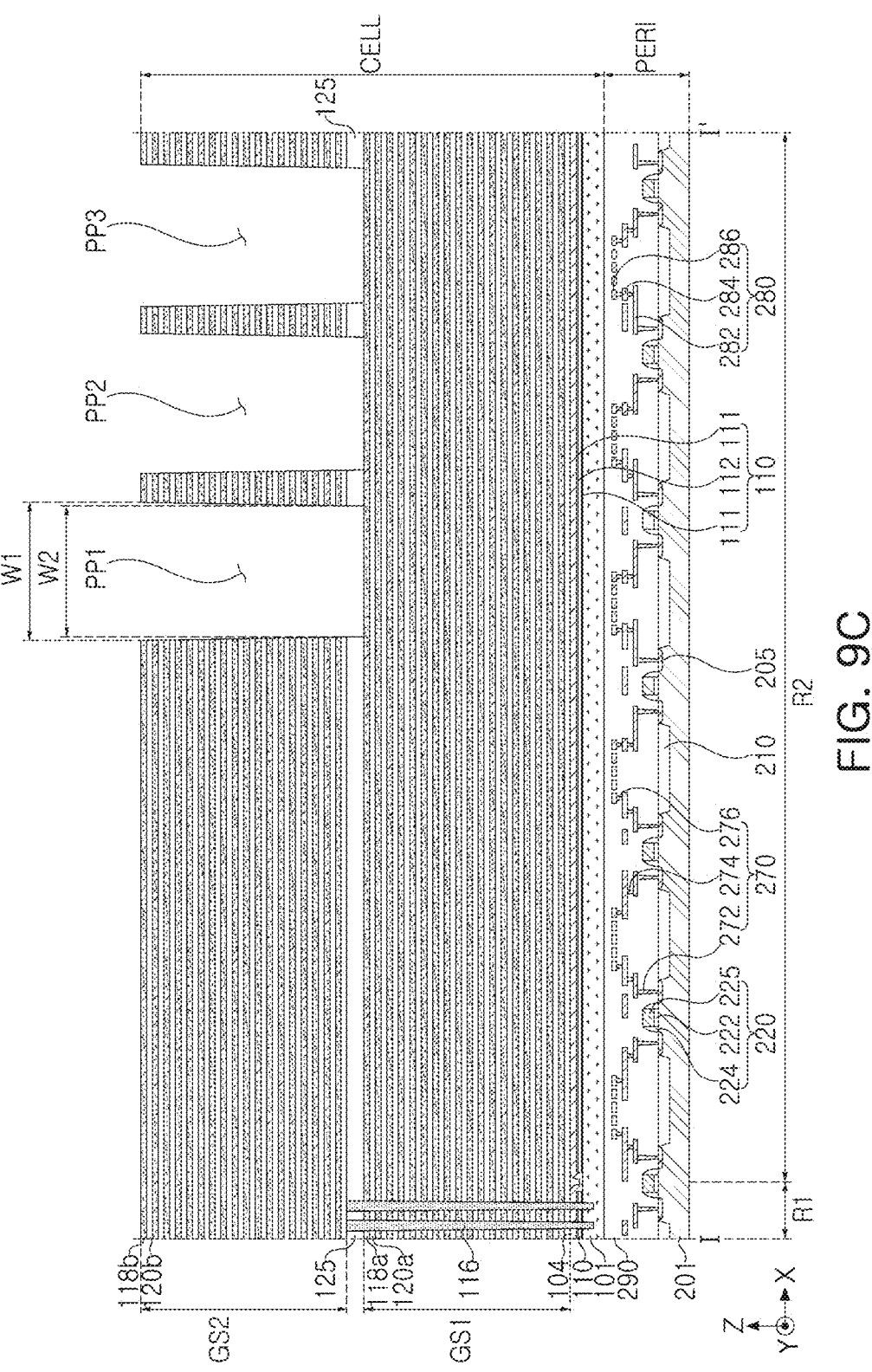

FIGS. 8 and 9C illustrate a process of forming a through portion penetrating the second stack structure (S13) of the method of manufacturing a semiconductor device (S10).

In the second region R2, at least one through portion PP1, PP2, and/or PP3 penetrating the second stack structure GS2 may be formed. The through portions PP1, PP2, and/or PP3 may penetrate the second stack structure GS2 and/or the capping insulating layer 125. The through portions PP1, PP2, and/or PP3 may be formed by an etching process of removing a partial region of the second stack structure GS2. The through portions PP1, PP2, and/or PP3 may be formed to overlap a region in which the first to third lower staircase regions STL1, STL2, and/or STL3 are formed in the z direction by a subsequent process (see FIG. 2A). A first width W1 of an upper end of the through portions PP1, PP2, and/or PP3 may be greater than a second width W2 of a lower end of the through portions PP1, PP2, and/or PP3. For example, at least one side surface of the through portions PP1, PP2, and/or PP3 may not be intermittent and may have a continuously inclined surface.

The through portions PP1, PP2, and/or PP3 may include a first through portion PP1, a second through portion PP2, and/or a third through portion PP3 spaced apart from each other in example embodiments. In example embodiments, the through portion may be connected as an integrated through region. The second sacrificial insulating layers 118b and/or the second interlayer insulating layers 120b of the second stack structure GS2 may remain between the plurality of first to third through portions PP1, PP2, and/or PP3 and may form portions protruding from the upper surface of the capping insulating layer 125

Figure 9D:
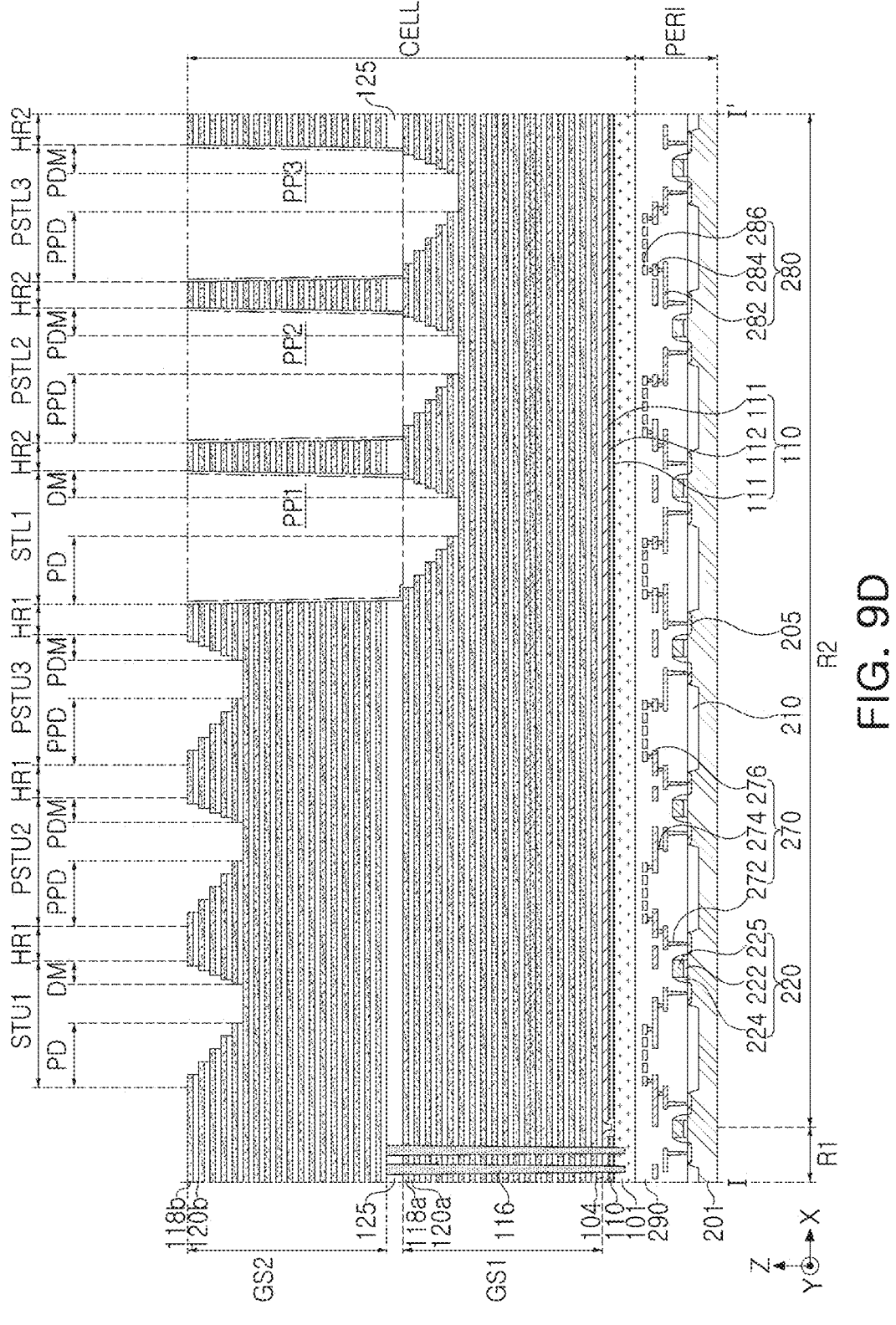

FIGS. 8 and 9D illustrate a process of forming a first upper staircase region, a second preliminary upper staircase region, a first lower staircase region, and a second preliminary lower staircase region process (S14) of the method of manufacturing the semiconductor device (S10).

A first mask layer may be formed on the second stack structure GS2. Next, the second stack structure GS2 exposed by the first mask layer and the first stack structure GS1 exposed by the first mask layer and the through portion may be simultaneously etched. A first upper staircase region STU1, a second preliminary upper staircase region PSTU2, and/or a third preliminary upper staircase region PSTU3 may be formed by etching the second stack structure GS2 by the first mask layer. By etching the first stack structure GS1 by the first mask layer, a first lower staircase region STL1, a second preliminary lower staircase region PSTL2, and/or a third preliminary lower staircase region PSTL2 may be formed.

The first mask layer may be, for example, a photoresist layer, and may be formed by a photolithography process. The process of trimming the first mask layer and the process of etching the second stack structure GS2 and the first stack structure GS1 may be repeatedly performed. When the process of trimming the first mask layer is repeated, the exposed area of the second stack structure GS2 and the first stack structure GS1 may gradually increase.

The first upper staircase region STU1, the second preliminary upper staircase region PSTU2, and/or the third preliminary upper staircase region PSTU3 may be formed to be spaced apart from each other in the x direction. The first lower staircase region STL1, the second preliminary lower staircase region PSTL2, and/or the third preliminary lower staircase region PSTL3 may be formed to be spaced apart from each other in the x direction.

Since the first upper staircase region STU1 and the first lower staircase region STL1 are formed together in the same process, the elements may have substantially the same shape. The second preliminary upper staircase region PSTU2 and/or the second preliminary lower staircase region PSTL2 may have substantially the same shape, and the third preliminary upper staircase region PSTU3 and the third preliminary lower staircase region PSTL3 may have substantially the same shape. In an example embodiment, depths of the first upper staircase region STU1, the second preliminary upper staircase region PSTU2, and/or the third preliminary upper staircase region PSTU3 may be the same. In an example embodiment, depths of the first lower staircase region STL1, the second preliminary lower staircase region PSTL2, and/or the third preliminary lower staircase region PSTL3 may be the same.

The first upper staircase region STU1 may include an upper pad region PD in which the second sacrificial insulating layers 118b extend by different lengths and/or a dummy region DM opposing the upper pad region PD. The first lower staircase region STL1 may include a lower pad region PD in which the first sacrificial insulating layers 118a extend by different lengths and/or a dummy region DM opposing the lower pad region PD. The pad regions PD may have a height decreasing in a direction of being further away from the first region R1, and the dummy regions DM may have a height increasing in a direction of being further away from the first region R1.

Each, or one or more, of the second preliminary upper staircase region PSTU2, the third preliminary upper staircase region PSTU3, the second preliminary lower staircase region PSTL2, and/or the third preliminary lower staircase region PSTL3 may have preliminary pad regions PPD having a height decreasing in a direction of being further away from the first region R1, and preliminary dummy regions PDM having a height increasing in a direction of being further away from the first region R1

In an example embodiment, the first and/or second stack structures GS1 and GS2 may be etched while sequentially increasing a region exposed by the second mask layer by trimming the second mask layer. In an example embodiment, the pad region PD and/or the dummy region DM may have different inclinations due to the second mask layer, but an example embodiment thereof is not limited thereto. In an example embodiment, the preliminary pad region PPD and the preliminary dummy region DM may have different inclinations due to the second mask layer.

Figure 9E:
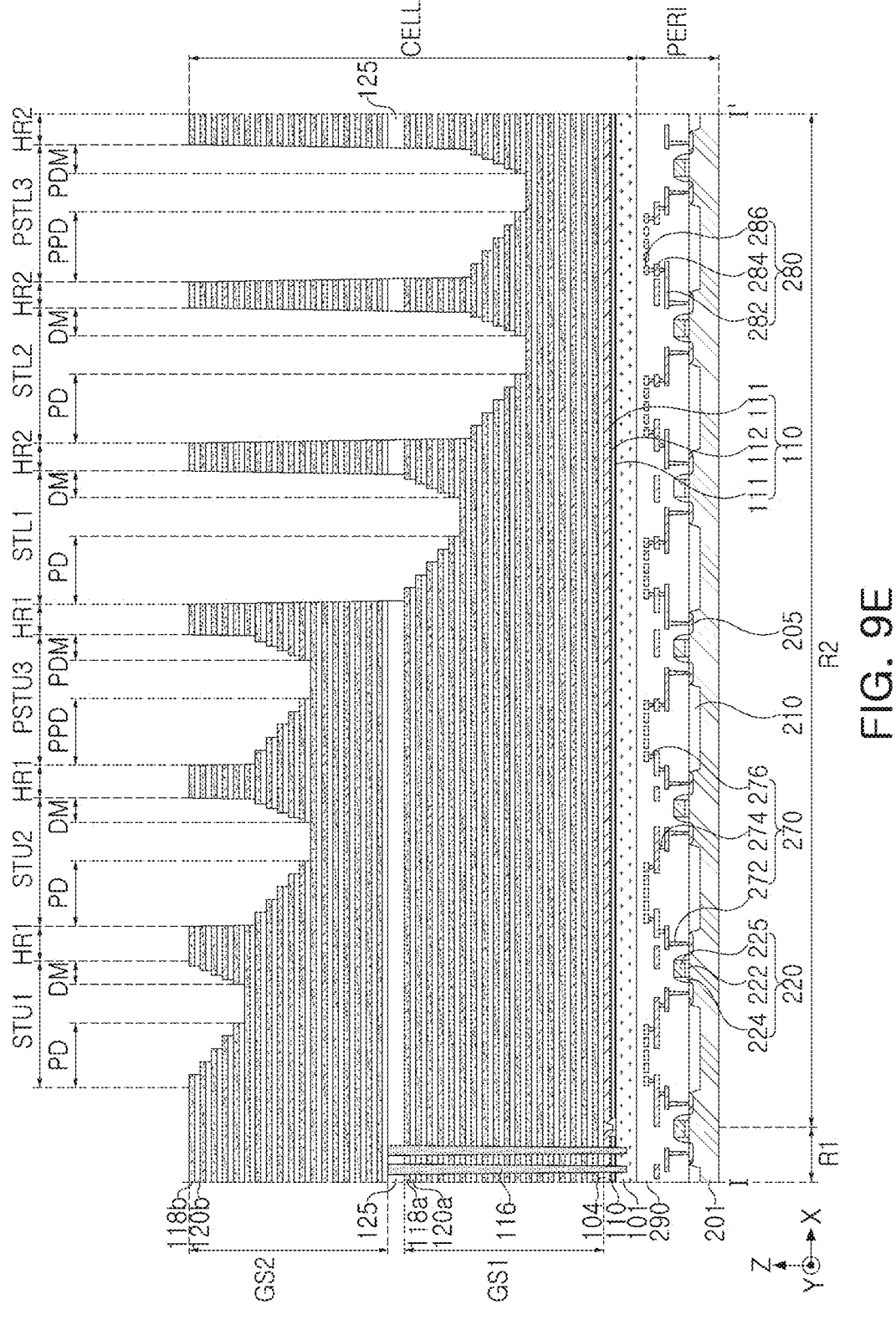

FIGS. 8 and 9E illustrate a process of forming a second upper staircase region and a second lower staircase region (S15) of the method of manufacturing a semiconductor device (S10).

A third mask layer may be formed on the second stack structure GS2. The third mask layer may be disposed on the first upper staircase region STU1 and the second lower staircase region STL1, and may expose a second preliminary upper staircase region PSTU2, a third preliminary upper staircase region PSTU3, a second preliminary lower staircase region PSTL2 and/or a third preliminary lower staircase region PSTL3.

Next, a portion of the second stack structure GS2 may be etched in each, or one or more, of the second preliminary upper staircase region PSTU2 and/or the third preliminary upper staircase region PSTU3 and/or a portion of the first stack structures GS1 may be etched in each, or one or more, of the second preliminary lower staircase region PSTL2 and the third preliminary lower staircase regions PSTL3, in a direction perpendicular to the upper surface of the second substrate 101. The second upper staircase region STU2 and/or the second lower staircase region STL2 may be formed by partially etching the second stack structure GS2 in the second preliminary upper staircase region PSTU2 and/or partially etching the first stack structure GS1 in the second preliminary lower staircase region PSTL2. Accordingly, the second upper staircase region STU2 may be disposed more adjacent to the second substrate 101 than the first upper staircase region STU1, and the second lower staircase region STL2 may be disposed more adjacent to the second substrate 101 than the first lower staircase region STL1. In an example embodiment, depths of the second upper staircase region STU2 and the third preliminary upper staircase region PSTU3 may be the same. In an example embodiment, depths of the second lower staircase region STL2 and the third preliminary lower staircase region PSTL3 may be the same.

Figure 9F:
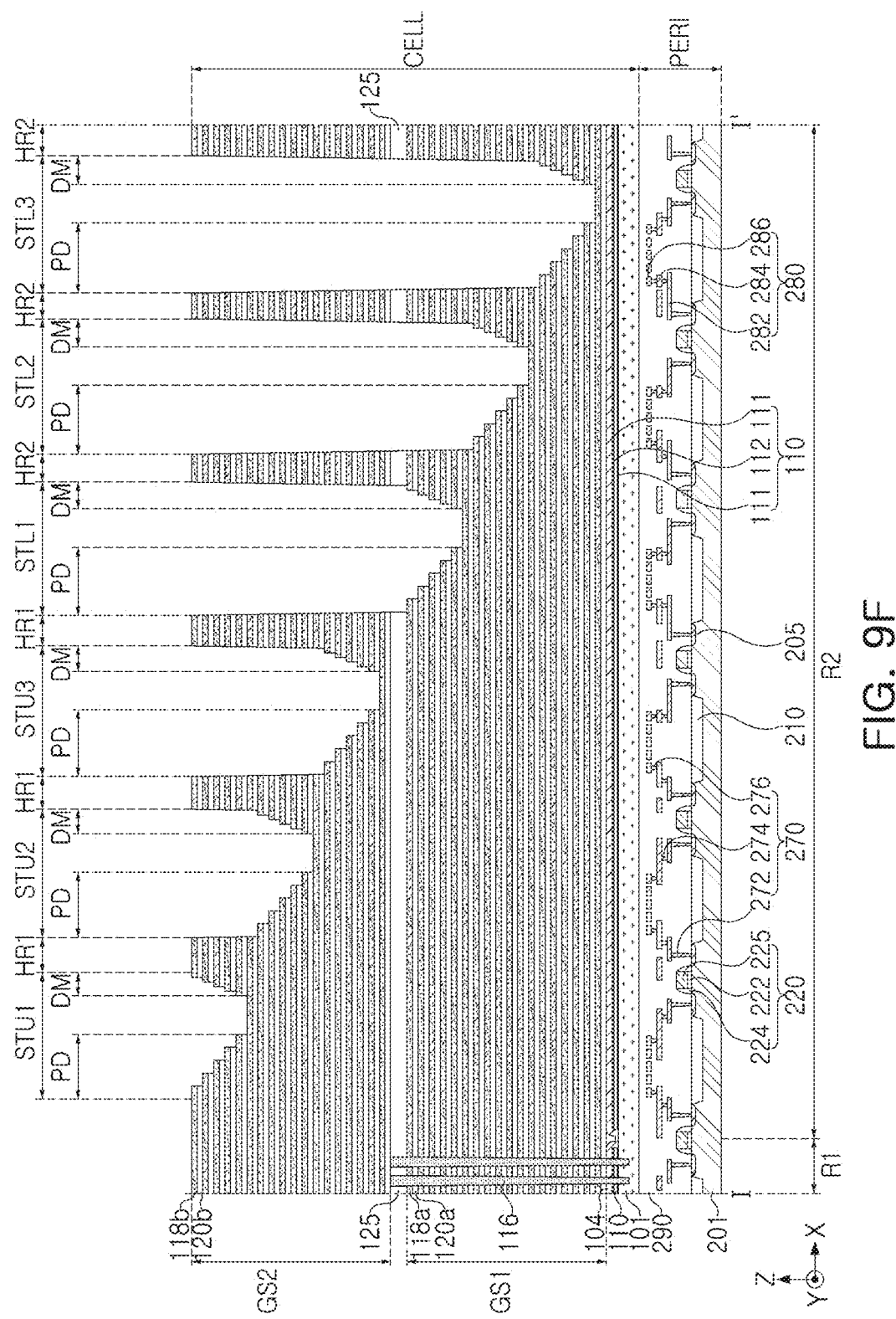

FIG. 9F illustrates a process of forming a third upper staircase region and a third lower staircase region.

A fourth mask layer may be formed on the second stack structure GS2. The fourth mask layer may be disposed on the first and second upper staircase regions STU1 and STU2 and the first and second lower staircase regions STL1 and STL2, and may expose the third preliminary upper staircase region PSTU3 and/or the third preliminary lower staircase region PSTL3.

Next, a portion of the second stack structure GS2 may be etched in the third preliminary upper staircase region PSTU3 and/or a portion of the first stack structures GS1 may be etched in the third preliminary lower staircase region PSTL3 in a direction perpendicular to the upper surface of the second substrate 101. Accordingly, the third upper staircase region STU3 and the third lower staircase region STL3 having the same shape may be formed. The third upper staircase region STU3 may be disposed more adjacent to the second substrate 101 than the second upper staircase region STU2, and the third lower staircase region STL3 may be disposed more adjacent to the second substrate 101 than the second lower staircase region STL2.

Figure 9G:
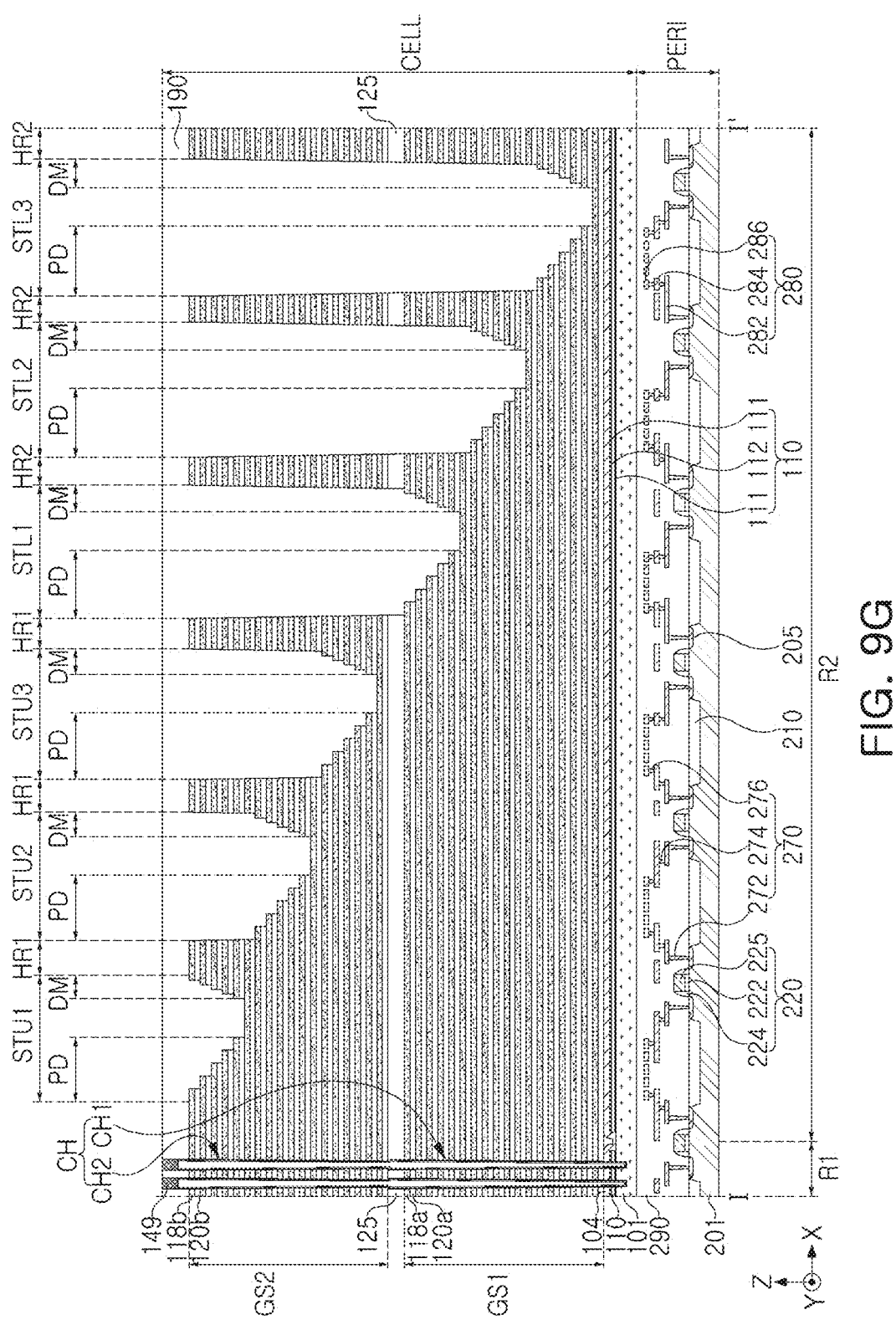

FIG. 9G illustrates a process of forming a channel structure penetrating through the first and second stack structures.

The cell region insulating layer 190 may be formed to cover the first and/or second stack structures GS1 and GS2.

The channel structures CH may be formed by forming upper channel holes to penetrate the second stack structure GS2, removing the channel sacrificial layers 116, forming the entire channel holes, and/or filling the entire channel holes. Specifically, the channel structures CH may be formed by forming the gate dielectric layer 145, the channel layer 140, the channel filling insulating layer 147, and/or the channel pad 149 in order in the entire channel holes. In this process, at least a portion of the gate dielectric layer 145 extending vertically along the channel layer 140 may be formed. The channel layer 140 may be formed on the gate dielectric layer 145 in the channel structures CH. The channel filling insulating layer 147 may be formed to fill the channel structures CH, and may be an insulating material. The channel pad 149 may be formed of a conductive material, such as, for example, polycrystalline silicon.

Figure 9H:
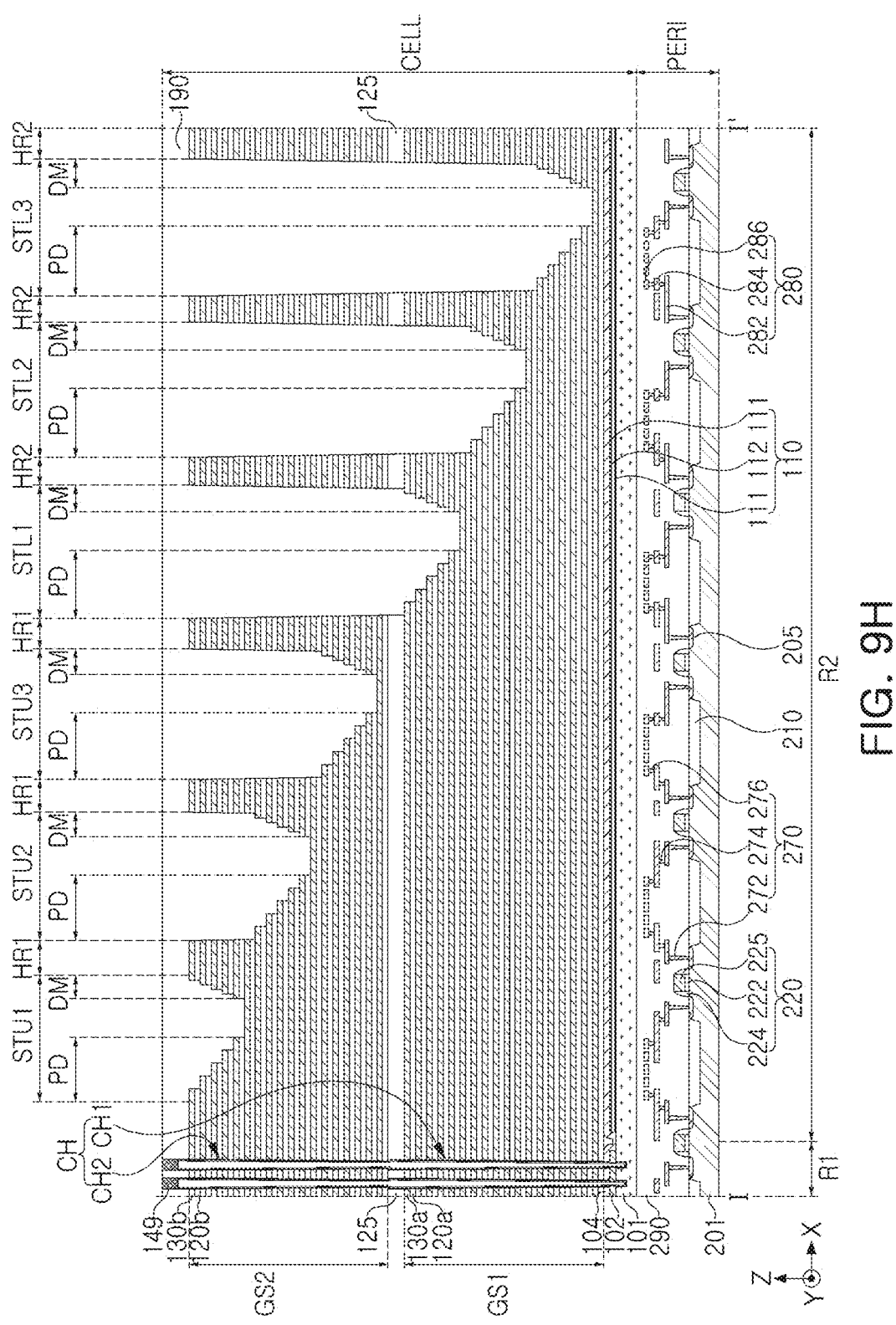

FIG. 9H illustrates a process of forming first and second gate electrodes.

Referring to FIG. 9H, openings penetrating the first and/or second stack structures GS1 and GS2 may be formed. Next, the first and/or second horizontal insulating layers 111 and 112 may be removed from the first region R1 through the openings, the first horizontal conductive layer 102 may be formed, the first and/or second sacrificial insulating layers 118a and 118b may be replaced with a conductive material, thereby forming the first and/or second gate electrodes 130a and 130b.

The openings may penetrate the first and/or second stack structures GS1 and GS2 and may extend in the x direction. The openings may be formed by performing an etching process in a region corresponding to the separation regions MS in FIG. 1.

The second horizontal insulating layer 112 may be exposed by performing an etch-back process while forming sacrificial spacer layers in the openings. The second horizontal insulating layer 112 may be selectively removed from the exposed region, and the upper and/or lower first horizontal insulating layers 111 may be removed.

The first and/or second horizontal insulating layers 111 and 112 may be removed by a wet etching process, for example. In the process of removing the first and/or second horizontal insulating layers 111 and 112, a portion of the gate dielectric layer 145 exposed in the region from which the second horizontal insulating layer 112 is removed may also be removed. The first horizontal conductive layer 102 may be formed by depositing a conductive material in the region from which the first and/or second horizontal insulating layers 111 and 112 are removed, and the sacrificial spacer layers may be removed from the openings.

Next, the first and/or second sacrificial insulating layers 118a and 118b may be selectively removed with respect to the first and/or second interlayer insulating layers 120a and 120b and/or the second horizontal conductive layer 104 using a wet etching process. Accordingly, a plurality of tunnel portions may be formed between the first and second interlayer insulating layers 120a and 120b. A conductive material forming the first and/or second gate electrodes 130a and 130b may fill the tunnel portions. The conductive material may include a metal, polycrystalline silicon, and/or a metal silicide material.

Next, referring to FIGS. 2A and 2B together, by forming the upper contacts 185 connected to the upper ends of the contact plugs 170a and the channel structures CH, the semiconductor device 100 may be manufactured.

Accordingly, as the first stack structure GS1 and the second stack structure GS2 are formed at a same time, a cost to produce semiconductor device formed according to the example embodiments may be reduced.

Figure 10:
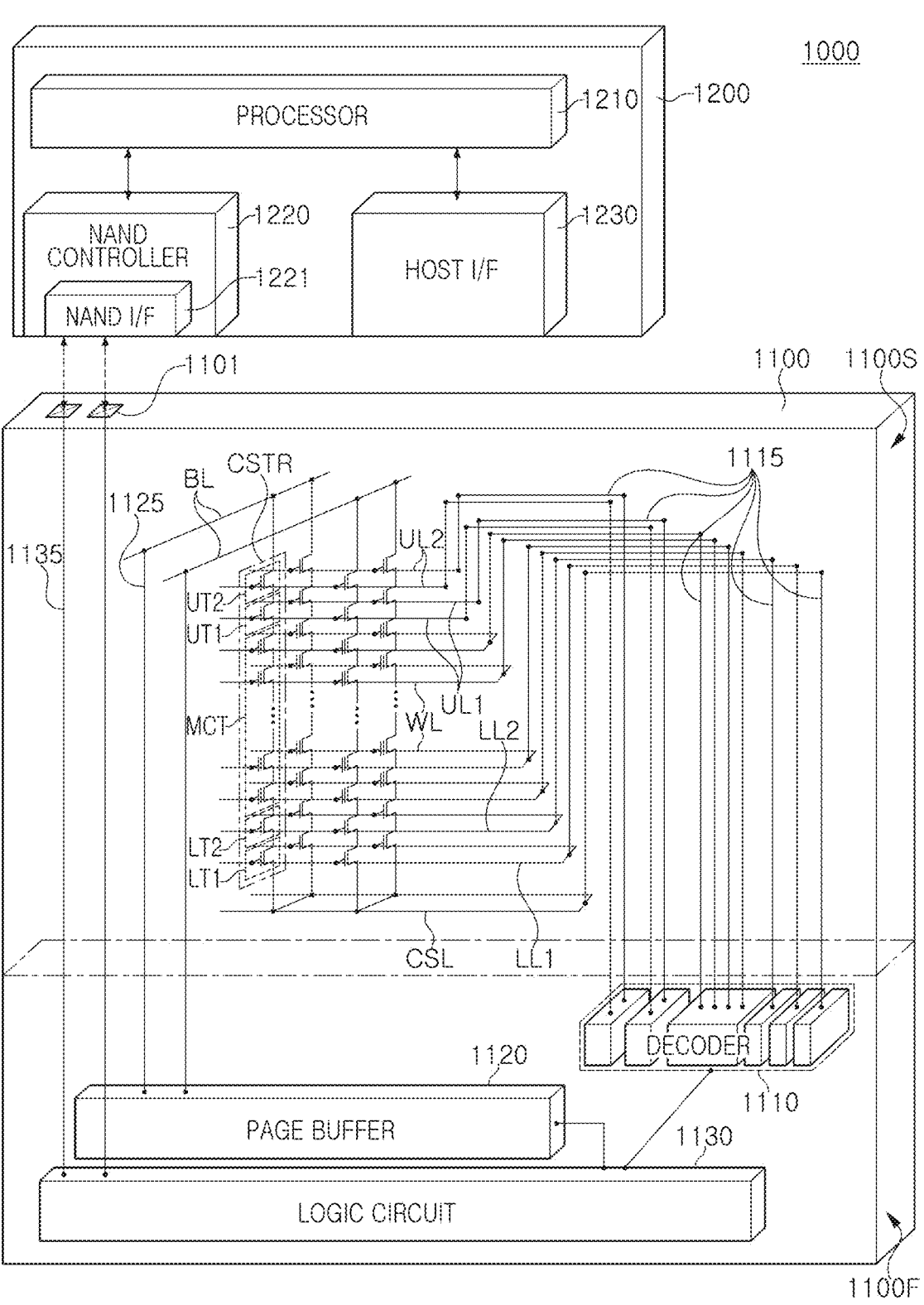
FIG. 10 is a diagram schematically illustrating a data storage system including a semiconductor device according to an example embodiment.

FIG. 10 is a diagram schematically illustrating a data storage system including a semiconductor device according to an example embodiment.

Referring to FIG. 10, a data storage system 1000 may include a semiconductor device 1100 and/or a controller 1200 electrically connected to the semiconductor device 1100. The data storage system 1000 may be implemented as a storage device including one or a plurality of semiconductor devices 1100 and/or an electronic device including a storage device. For example, the data storage system 1000 may be implemented as a solid state drive (SSD) device, a universal serial bus (USB), a computing system, a medical device, and/or a communication device, including one or a plurality of semiconductor devices 1100.

The semiconductor device 1100 may be implemented as a nonvolatile memory device, and/or may be implemented as the NAND flash memory device described with reference to FIGS. 1 to 7, for example. The semiconductor device 1100 may include a first semiconductor structure 1100F and/or a second semiconductor structure 1100S on the first semiconductor structure 1100F. In example embodiments, the first semiconductor structure 1100F may be disposed on the side of the second semiconductor structure 1100S. The first semiconductor structure 1100F may be configured as a peripheral circuit structure including a decoder circuit 1110, a page buffer 1120, and/or a logic circuit 1130. The second semiconductor structure 1100S may be configured as a memory cell structure including a bit line BL, a common source line CSL, word lines WL, first and/or second gate upper lines UL1 and UL2, first and/or second gate lower lines LL1 and/or LL2, and/or memory cell strings CSTR between the bit line BL and/or the common source line CSL.

In the second semiconductor structure 1100S, each, or one or more, of the memory cell strings CSTR may include lower transistors LT1 and/or LT2 adjacent to the common source line CSL, upper transistors UT1 and/or d UT2 adjacent to the bit line BL, and/or a plurality of memory cell transistors MCT disposed between the lower transistors LT1 and/or LT2 and the upper transistors UT1 and/or UT2. The number of the lower transistors LT1 and/or LT2 and the number of the upper transistors UT1 and/or UT2 may be varied in example embodiments.

In example embodiments, the upper transistors UT1 and/or UT2 may include a string select transistor, and/or the lower transistors LT1 and/or LT2 may include a ground select transistor. The gate lower lines LL1 and/or LL2 may be gate electrodes of the lower transistors LT1 and/or LT2, respectively. The word lines WL may be gate electrodes of the memory cell transistors MCT, and/or the gate upper lines UL1 and/or UL2 may be gate electrodes of the upper transistors UT1 and/or UT2, respectively.

In example embodiments, the lower transistors LT1 and/or LT2 may include a lower erase control transistor LT1 and/or a ground select transistor LT2 connected to each other in series. The upper transistors UT1 and/or UT2 may include a string select transistor UT1 and/or an upper erase control transistor UT2 connected to each other in series. At least one of the lower erase control transistor LT1 and/or the upper erase control transistor UT1 may be used for an erase operation of erasing data stored in the memory cell transistors MCT using a GIDL phenomenon.

The common source line CSL, the first and/or second gate lower lines LL1 and LL2, the word lines WL, and/or the first and second gate upper lines UL1 and UL2 may be electrically connected to the decoder circuit 1110 through first connection interconnections 1115 extending from the semiconductor structure 1100F to the second semiconductor structure 1100S. The bit lines BL may be electrically connected to the page buffer 1120 through second connection interconnections 1125 extending from the first semiconductor structure 1100F to the second semiconductor structure 1100S.

In the first semiconductor structure 1100F, the decoder circuit 1110 and the page buffer 1120 may perform a control operation on at least one selected memory cell transistor among the plurality of memory cell transistors MCT. The decoder circuit 1110 and/or the page buffer 1120 may be controlled by the logic circuit 1130. The semiconductor device 1000 may communicate with the controller 1200 through an input and output pad 1101 electrically connected to the logic circuit 1130. The input and output pad 1101 may be electrically connected to the logic circuit 1130 through an input and output connection interconnection 1135 extending from the first semiconductor structure 1100F to the second semiconductor structure 1100S.

The controller 1200 may include a processor 1210, a NAND controller 1220, and/or a host interface 1230. In example embodiments, the data storage system 1000 may include a plurality of semiconductor devices 1100, and in this case, the controller 1200 may control the plurality of semiconductor devices 1000.

The processor 1210 may control overall operation of the data storage system 1000 including the controller 1200. The processor 1210 may operate according to a predetermined (or alternately given) firmware, and may access the semiconductor device 1100 by controlling the NAND controller 1220. The NAND controller 1220 may include a NAND interface 1221 for processing communication with the semiconductor device 1100. Control commands for controlling the semiconductor device 1100, data to be written in the memory cell transistors MCT of the semiconductor device 1100, and data to be read from the memory cell transistors MCT of the semiconductor device 1100 may be transmitted through the NAND interface 1221. The host interface 1230 may provide a communication function between the data storage system 1000 and an external host. When a control command is received from an external host through the host interface 1230, the processor 1210 may control the semiconductor device 1100 in response to the control command.

Figure 11:
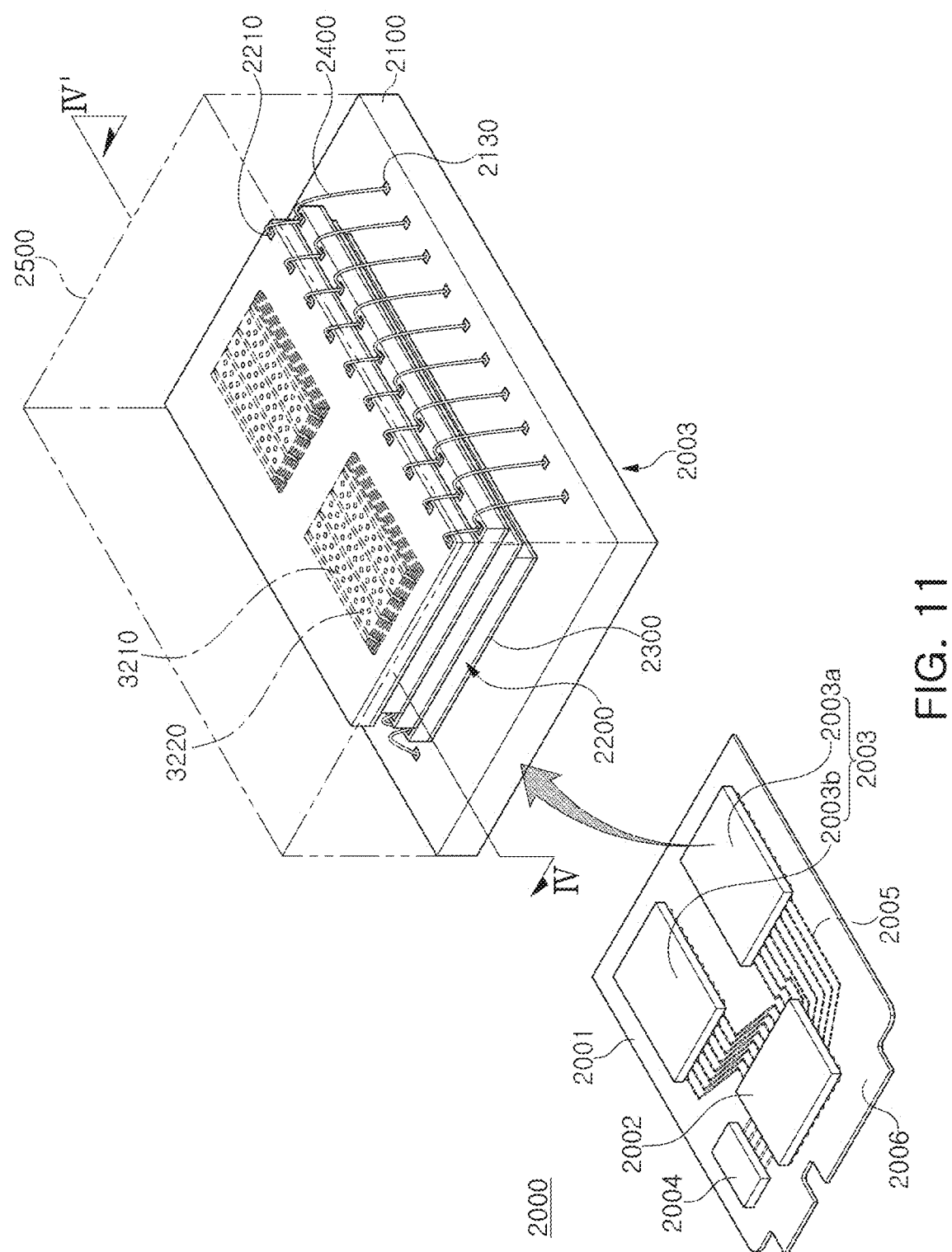
FIG. 11 is a perspective view schematically illustrating a data storage system including a semiconductor device according to an example embodiment.

FIG. 11 is a perspective view schematically illustrating a data storage system including a semiconductor device according to an example embodiment.

Referring to FIG. 11, a data storage system 2000 according to an example embodiment may include a main substrate 2001, a controller 2002 mounted on the main substrate 2001, one or more semiconductor packages 2003, and/or a DRAM 2004. The semiconductor package 2003 and/or the DRAM 2004 may be connected to the controller 2002 by interconnection patterns 2005 formed on the main substrate 2001.

The main substrate 2001 may include a connector 2006 including a plurality of pins coupled to an external host. The number and/or the arrangement of the plurality of pins in the connector 2006 may be varied depending on a communication interface between the data storage system 2000 and the external host. In example embodiments, the data storage system 2000 may communication with the external host through one of a universal serial bus (USB), a peripheral component interconnect express (PCI-Express), a serial advanced technology attachment (SATA), and/or an M-phy for universal flash storage (UFS). In example embodiments, the data storage system 2000 may operate by power supplied from the external host through the connector 2006. The data storage system 2000 may further include a power management integrated circuit (PMIC) for distributing power supplied from the external host to the controller 2002 and the semiconductor package 2003.

The controller 2002 may write data to the semiconductor package 2003 and/or may read data from the semiconductor package 2003, and/or may improve an operation speed of the data storage system 2000.

The DRAM 2004 may be configured as a buffer memory for mitigating a difference in speeds between the semiconductor package 2003, a data storage space, and/or an external host. The DRAM 2004 included in the data storage system 2000 may also operate as a cache memory, and/or may provide a space for temporarily storing data in a control operation for the semiconductor package 2003. When the DRAM 2004 is included in the data storage system 2000, the controller 2002 further may include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each, or one or more, of the first and/or second semiconductor packages 2003a and 2003b may be configured as a semiconductor package including a plurality of semiconductor chips 2200. Each, or one or more, of the first and/or second semiconductor packages 2003a and 2003b may include a package substrate 2100, semiconductor chips 2200 on the package substrate 2100, adhesive layers 2300 disposed on a lower surface of each, or one or more, of the semiconductor chips 2200, a connection structure 2400 electrically connecting the semiconductor chips 2200 to the package substrate 2100, and/or a molding layer 2500 covering the semiconductor chips 2200 and the connection structure 2400 on the package substrate 2100.

The package substrate 2100 may be configured as a printed circuit board including the package upper pads 2130. Each, or one or more, of the semiconductor chips 2200 may include an input and output pad 2210. The input and output pad 2210 may correspond to the input and output pad 1101 in FIG. 10. Each, or one or more, of the semiconductor chips 2200 may include gate stack structures 3210 and/or channel structures 3220. Each, or one or more, of the semiconductor chips 2200 may include the semiconductor device described with reference to FIGS. 1 to 7.

In example embodiments, the connection structure 2400 may be a bonding wire electrically connecting the input and output pad 2210 to the package upper pads 2130. Accordingly, in each, or one or more, of the first and/or second semiconductor packages 2003a and 2003b, the semiconductor chips 2200 may be electrically connected to each other through a bonding wire method, and/or may be electrically connected to the package upper pads 2130 of the package substrate 2100. In example embodiments, in each, or one or more, of the first and/or second semiconductor packages 2003a and 2003b, the semiconductor chips 2200 may be electrically connected to each other by a connection structure a through silicon via (TSV), instead of the connection structure 2400 of a bonding wire method.

In example embodiments, the controller 2002 and the semiconductor chips 2200 may be included in a single package. For example, the controller 2002 and the semiconductor chips 2200 may be mounted on a separate interposer substrate different from the main substrate 2001, and the controller 2002 may be connected to the semiconductor chips 2200 by interconnections formed on the interposer substrate.

Figure 12:
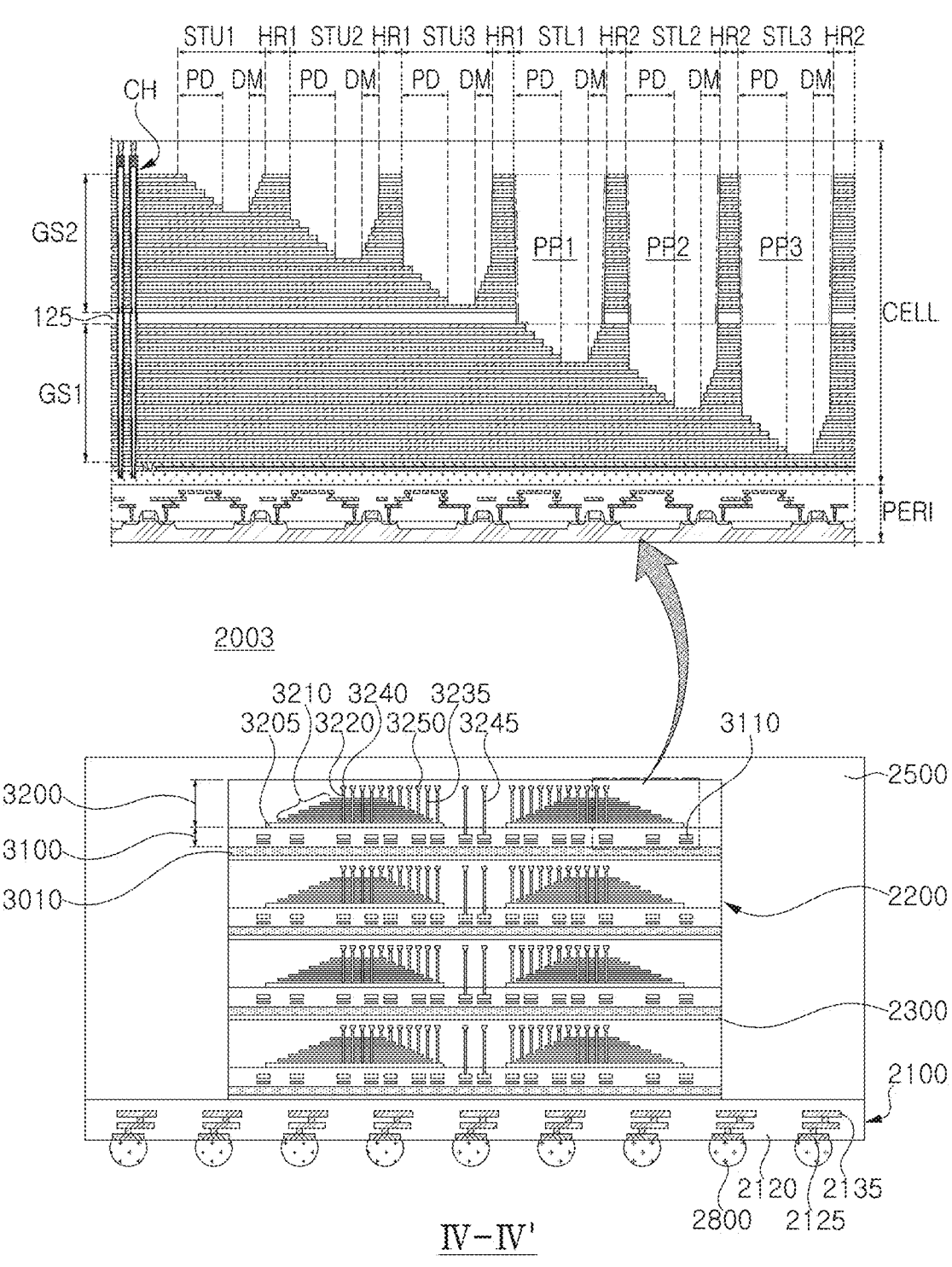
FIG. 12 is a cross-sectional view schematically illustrating a semiconductor package according to an example embodiment.

FIG. 12 is a cross-sectional view schematically illustrating a semiconductor device according to an example embodiment. FIG. 12 illustrates an example embodiment of the semiconductor package 2003 in FIG. 11, and illustrates the semiconductor package 2003 in FIG. 11 taken along line IV-IV'.

Referring to FIG. 12, in the semiconductor package 2003, the package substrate 2100 may be configured as a printed circuit board. The package substrate 2100 may include a package substrate body portion 2120, package upper pads 2130 (see FIG. 11) disposed on an upper surface of the package substrate body portion 2120, lower pads 2125 disposed on a lower surface of the package substrate body portion 2120 or exposed through the lower surface, and/or internal interconnections 2135 electrically connecting the upper pads 2130 to the lower pads 2125 in the package substrate body portion 2120. The upper pads 2130 may be electrically connected to the connection structures 2400. The lower pads 2125 may be connected to the interconnection patterns 2005 of the main substrate 2010 of the data storage system 2000 through conductive connection portions 2800 as in FIG. 11.

Each, or one or more, of the semiconductor chips 2200 may include a semiconductor substrate 3010 and/or a first structure 3100 and/or a second structure 3200 stacked in order on the semiconductor substrate 3010. The first structure 3100 may include a peripheral circuit region including peripheral interconnections 3110. The second structure 3200 may include a common source line 3205, a gate stack structure 3210 on the common source line 3205, channel structures 3220 and/or separation structures 3230 penetrating the gate stack structure 3210, bit lines 3240 electrically connected to the memory channel structures 3220, and/or contact plugs 3235 electrically connected to the word lines WL (see FIG. 10) of the gate stack structure 3210. As described with reference to FIGS. 1 to 7, in each, or one or more, of the semiconductor chips 2200, a second stack structure GS2 includes a first upper staircase region STU1, a second upper staircase region STU2, a third upper staircase region STU3, and/or at least one through portion PP1, PP2, and/or PP3 penetrating the second stack structure GS2. Also, in each, or one or more, of the semiconductor chips 2200, a first stack structure GS1 includes a first lower staircase region PPL1, a second lower staircase region PPL2, and/or a third lower staircase region PPL3, connected to the through portion PP1, PP2, and/or PP3. At least one side surface of the through portion PP1, PP2, and/or PP3 has a continuous slope to the first to third lower staircase regions PPL1, PPL2, and/or PPL3.

Each, or one or more, of the semiconductor chips 2200 may include a through interconnection 3245 electrically connected to the peripheral interconnections 3110 of the first semiconductor structure 3100 and extending into the second semiconductor structure 3200. The through interconnection 3245 may be disposed on an external side of the gate stack structure 3210, and may be further disposed to penetrate the gate stack structure 3210. Each, or one or more, of the semiconductor chips 2200 may further include an input and output pad 2210 (see FIG. 11) electrically connected to the peripheral interconnections 3110 of the first semiconductor structure 3100.

According to the aforementioned example embodiments, by configuring the portion connected to the contact plug to protrude further than the lower gate electrodes in the pad region of the gate electrode, a semiconductor device having improved reliability and a data storage system including the same may be provided.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the example embodiments have been illustrated and described above, it will be apparent to those skilled in the art that modifications and variations could be made without departing from the scope of the present disclosure as defined by the appended claims.

What is claimed is:

1. A semiconductor device, comprising:

a substrate having a first region and a second region;

a first stack structure including first gate electrodes spaced apart from each other on the substrate and first interlayer insulating layers alternately stacked with the first gate electrodes;

a capping insulating layer on the first stack structure;

a second stack structure on the capping insulating layer and including second gate electrodes spaced apart from each other on the capping insulating layer and second interlayer insulating layers alternately stacked with the second gate electrodes; and channel structures penetrating the first stack structure and the second stack structure, the channel structures including a channel layer, in the first region, wherein the first stack structure includes a first lower staircase region, a second lower staircase region more adjacent to the substrate than the first lower staircase region, a third lower staircase region more adjacent to the substrate than the second lower staircase region, and first protrusions of the alternately stacked the first interlayer insulating layers and the first gate electrodes between the first lower staircase region and the second lower staircase region and between the second lower staircase region and the third lower staircase region, in the second region, the first lower staircase region, the second lower staircase region, and the third lower staircase region being below the capping insulating layer, wherein the second stack structure includes a first upper staircase region, a second upper staircase region more adjacent to the substrate than the first upper staircase region, a third upper staircase region more adjacent to the substrate than the second upper staircase region, and a through portion penetrating the second stack structure and the capping insulating layer and connected to the first lower staircase region, the second lower staircase region, and the third lower staircase region, in the second region, wherein the through portion has a first width on a lower end and has a second width greater than the first width on an upper end, wherein the first lower staircase region has a same shape as a shape of the first upper staircase region, the second lower staircase region has a same shape as a shape of the second upper staircase region, and the third lower staircase region has a same shape as a shape of the third upper staircase region, wherein the through portion is a single opening over the first lower staircase region, and the second lower staircase region, and the third lower staircase region, wherein upper surfaces of the first protrusions are on a same level as a level of an upper surface of an uppermost first gate electrode among the first gate electrodes, and wherein the first protrusions have no the first interlayer insulating layers and no the first gate electrodes above the upper surfaces of the first protrusions.

2. The semiconductor device of claim 1, wherein the first lower staircase region, the second lower staircase region, and the third lower staircase region are spaced apart from each other in a first direction from the first region toward the second region in order from the first lower staircase region to the third lower staircase region, and wherein the first upper staircase region, the second upper staircase region, and the third upper staircase region are spaced apart from each other in the first direction in order from the first region.

3. The semiconductor device of claim 1, wherein each of the first lower staircase region, the second lower staircase region, the third lower staircase region, the first upper staircase region, the second upper staircase region, and the third upper staircase region includes a pad region having a height decreasing in a direction of being further away from the first region, and a dummy region opposing the pad region and having a height increasing in a direction of being further away from the first region.

4. The semiconductor device of claim 3, wherein the pad region has a first slope, and the dummy region has a second slope greater than the first slope.

5. The semiconductor device of claim 3, further comprising:

a plurality of contact plugs connected to the first gate electrodes in the pad region of each of the first lower staircase region, the second lower staircase region, and the third lower staircase region, and connected to the second gate electrodes in the pad region of each of the first upper staircase region, the second upper staircase region, and the third upper staircase region.

6. The semiconductor device of claim 1, further comprising:

second protrusions between the first upper staircase region and the second upper staircase region and between the second upper staircase region and the third upper staircase region, wherein upper surfaces of the second protrusions are on a same level as a level of an upper surface of an uppermost second gate electrode among the second gate electrodes in the first region.

7. The semiconductor device of claim 1, wherein the through portion is above the first lower staircase region, the second lower staircase region, the third lower staircase region, and the first protrusions.

8. The semiconductor device of claim 1, wherein a thickness of the capping insulating layer is greater than a thickness of each first interlayer insulating layer of the first interlayer insulating layers and a thickness of each second interlayer insulating layer of the second interlayer insulating layers.

9. The semiconductor device of claim 1, further comprising:

a semiconductor structure below the substrate, wherein the semiconductor structure includes a base substrate, circuit devices on the base substrate, and lower wiring lines electrically connected to the circuit devices.

10. A semiconductor device, comprising:

a substrate having a first region and a second region;

a first stack structure including first gate electrodes spaced apart from each other on the substrate and first interlayer insulating layers alternately stacked with the first gate electrodes;

a second stack structure including second gate electrodes spaced apart from each other on the first stack structure and second interlayer insulating layers alternately stacked with the second gate electrodes;

a capping insulating layer between the first stack structure and the second stack structure and having a thickness greater than a thickness of each of the first interlayer insulating layers and a thickness of each of the second interlayer insulating layers; and channel structures penetrating the first stack structure and the second stack structure and including a channel layer, in the first region, wherein the first stack structure includes a first lower staircase region, a second lower staircase region more adjacent to the substrate than the first lower staircase region, and a first protrusion of the alternately stacked the first interlayer insulating layers and the first gate electrodes between the first lower staircase region and the second lower staircase region, in the second region, the first lower staircase region and the second lower staircase region being spaced apart from each other in a first direction below the capping insulating layer, wherein the second stack structure includes a first upper staircase region, a second upper staircase region more adjacent to the substrate than the first upper staircase region, and a through portion penetrating the second stack structure and the capping insulating layer and connected to the first lower staircase region and the second lower staircase region, in the second region, the first upper staircase region, the second upper staircase region, and the through portion being spaced apart from each other in the first direction on the capping insulating layer, wherein at least one side surface of the through portion has a continuous slope to the first lower staircase region and the second lower staircase region, wherein the through portion is a single opening over the first lower staircase region and the second lower staircase region, wherein an upper surface of the first protrusion is on a same level as a level of an upper surface of an uppermost first gate electrode among the first gate electrodes, and wherein the first protrusion has no the first interlayer insulating layers and no the first gate electrodes above the upper surface of the first protrusion.

11. The semiconductor device of claim 10, wherein each of the first lower staircase region and the second lower staircase region includes a pad region having a height decreasing in a direction of being further away from the first region and having a first slope, and a dummy region opposing the pad region, the dummy region having a height increasing in a direction of being further away from the first region, and having a second slope greater than the first slope, and wherein a side surface of the through portion has a third slope greater than the first slope and the second slope.

12. The semiconductor device of claim 10, further comprising:

a second protrusion between the first upper staircase region and the second upper staircase region.

13. The semiconductor device of claim 12, wherein an upper surface of the second protrusion is on a same level as a level of an upper surface of an uppermost second gate electrode of the second gate electrodes in the first region.

14. A data storage system, comprising:

a semiconductor storage device including:

a first substrate;

circuit devices on the first substrate;

lower wiring lines electrically connected to the circuit devices;

a second substrate on the lower wiring lines, the second substrate having a first region and a second region;

a first stack structure including first gate electrodes spaced apart from each other on the second substrate and first interlayer insulating layers stacked alternately with the first gate electrodes;

a second stack structure including second gate electrodes spaced apart from each other on the first stack structure and second interlayer insulating layers alternately stacked with the second gate electrodes;

a capping insulating layer between the first stack structure and the second stack structure, the capping insulating layer having a thickness greater than a thickness of each of the first interlayer insulating layers and a thickness of each of the second interlayer insulating layers;

channel structures penetrating the first stack structure and the second stack structure in the first region, the channel structures including a channel layer; and an input/output pad electrically connected to the circuit devices; and a controller electrically connected to the semiconductor storage device through the input/output pad and configured to control the semiconductor storage device, wherein the first stack structure includes a first lower staircase region, a second lower staircase region more adjacent to the first substrate than the first lower staircase region, and a protrusion of the alternately stacked the first interlayer insulating layers and the first gate electrodes between the first lower staircase region and the second lower staircase region, in the second region, the first lower staircase region and the second lower staircase region being spaced apart from each other in a first direction below the capping insulating layer, wherein an upper surface of the protrusion is on a same level as a level of an upper surface of an uppermost first gate electrode among the first gate electrodes, wherein the protrusion has no the first interlayer insulating layers and no the first gate electrodes above the upper surface of the protrusion, wherein the second stack structure includes a first upper staircase region, a second upper staircase region more adjacent to the first substrate than the first upper staircase region, and a through portion penetrating the second stack structure and the capping insulating layer and connected to the first lower staircase region and the second lower staircase region, in the second region, the first upper staircase region, the second upper staircase region, and the through portion being spaced apart from each other in the first direction on the capping insulating layer, wherein the through portion is a single opening over the first lower staircase region and the second lower staircase region, and wherein at least one side surface of the through portion has a continuous slope to the first lower staircase region and the second lower staircase region.

15. The data storage system of claim 14, wherein the first lower staircase region has a same shape as a shape of the first upper staircase region, and wherein the second lower staircase region has a same shape as a shape of the second upper staircase region.

* * * * *